(12) United States Patent
Yamada et al.

(10) Patent No.: US 8,664,677 B2
(45) Date of Patent: Mar. 4, 2014

(54) LIGHT-EMITTING ELEMENT AND ORGANIC ELECTROLUMINESCENT DISPLAY DEVICE

(75) Inventors: Jiro Yamada, Kanagawa (JP); Eisuke Negishi, Tokyo (JP); Hirofumi Nakamura, Kanagawa (JP); Akifumi Nakamura, Kanagawa (JP); Tadahiko Yoshinaga, Kanagawa (JP)

(73) Assignee: Sony Corporation, Tokyo (JP)

( * ) Notice: Subject to any disclaimer, the term of this patent is extended or adjusted under 35 U.S.C. 154(b) by 408 days.

(21) Appl. No.: 13/054,840

(22) PCT Filed: Jul. 28, 2009

(86) PCT No.: PCT/JP2009/063379
§ 371 (c)(1),
(2), (4) Date: Jan. 19, 2011

(87) PCT Pub. No.: WO2010/013689
PCT Pub. Date: Feb. 4, 2010

(65) Prior Publication Data
US 2011/0121346 A1    May 26, 2011

(30) Foreign Application Priority Data

Jul. 29, 2008  (JP) .................................. 2008-194699
Jul. 17, 2009  (JP) .................................. 2009-168511

(51) Int. Cl.
*H01L 33/00* (2010.01)
(52) U.S. Cl.
USPC .................................... 257/98; 257/E51.018
(58) Field of Classification Search
USPC ............ 257/40, 59, 79, 98, 613, 642, E33.06, 257/E51.018
See application file for complete search history.

(56) References Cited

U.S. PATENT DOCUMENTS

| | | | |
|---|---|---|---|
| 7,102,282 B1* | 9/2006 | Yamada et al. | 313/506 |
| 8,426,862 B2* | 4/2013 | Arai | 257/59 |
| 2005/0162071 A1* | 7/2005 | Lee et al. | 313/503 |
| 2007/0001570 A1 | 1/2007 | Nomura et al. | |
| 2007/0246723 A1* | 10/2007 | Moriya et al. | 257/98 |

FOREIGN PATENT DOCUMENTS

| | | |
|---|---|---|
| JP | 2001-035667 | 2/2001 |
| JP | 2005-209647 | 8/2005 |
| JP | 2006-338916 | 12/2006 |

(Continued)

OTHER PUBLICATIONS

International Search Report corresponding to PCT/JP09/063379 dated Sep. 1, 2009.

*Primary Examiner* — Vongsavanh Sengdara
(74) *Attorney, Agent, or Firm* — Dentons US LLP

(57) ABSTRACT

Provided is a light-emitting element in the structure and configuration of causing no possibility of a short circuit between first and second electrodes even if there is any foreign substance or a protrusion on the first electrode. Such a light-emitting element is configured to include, in order, a first electrode 21, an organic layer 23 including a light-emitting layer made of an organic light-emitting material, a semi-transmissive/reflective film 40, a resistance layer 50, and a second electrode 22. The first electrode 21 reflects a light coming from the light-emitting layer, and the second electrode 22 passes through a light coming from the semi-transmissive/reflective film 40 after passing therethrough. The semi-transmissive/reflective film on the organic layer 23 has an average film thickness of 1 nm to 6 nm both inclusive.

16 Claims, 13 Drawing Sheets

(56) References Cited　　　　　　　　　　　　* cited by examiner

FOREIGN PATENT DOCUMENTS

| | | |
|---|---|---|
| JP | 2007-43104 | 2/2007 |
| WO | 01/39554 | 5/2001 |
| WO | 2006/098188 | 9/2006 |

(A) [STEP-130]

(B) [STEP-140]

(A) [STEP—150]

(B) [STEP—170]

LIGHT-EMITTING ELEMENT AND ORGANIC ELECTROLUMINESCENT DISPLAY DEVICE

TECHNICAL FIELD

The present invention relates to a light-emitting element in the configuration of a resonator, and an organic electroluminescent display device provided therein with this light-emitting element.

BACKGROUND ART

In recent years, as a display device for alternative use of a liquid crystal display device, an organic electroluminescent display device (organic EL display device) using organic electroluminescent elements (organic EL elements) are receiving attention. The organic EL display device is of a self-luminous type, and has characteristics of low power consumption. It is also considered as having the response characteristic of a sufficient level also with respect to a high-speed video signal with high definition, and thus is under active development for practical use thereof.

The organic EL element generally has the lamination configuration in which a first electrode, an organic layer, and a second electrode are disposed one on the other. The organic layer includes a light-emitting layer made of an organic light-emitting material. With such an organic EL element, an attempt has been made to control light to be generated in the light-emitting layer by configuring the organic EL element like a resonator, i.e., by seeking to find the optimal thickness of each of the layers configuring the organic layer (as an example, refer to the brochure of WO 01/39554). Controlling the light as such includes improving the purity of color of light emission, increasing the efficiency of light emission, and others.

With the configuration of a resonator used as such, however, there may be a possibility of causing a problem to the viewing angle dependence of the chromaticity and luminance, that is, with a larger viewing angle, causing a problem of largely shifting the peak wavelength in the spectrum of a light coming from the organic EL display device, or greatly reducing the intensity of light, for example. In consideration thereof, keeping the level of resonance as low as possible is preferable, that is, making the organic layer as thin as possible is preferable (refer to WO 01/39554 pamphlet described above). However, with the organic layer reduced in thickness, as schematically shown in FIG. 13, if there is any particle (foreign substance) or protrusion on the first electrode, it means that the resulting organic layer does not provide the perfect coverage, thereby possibly causing a short circuit between the first and second electrodes. If such a short circuit occurs, in an active-matrix organic EL display device, any pixel in which such a short circuit is occurring becomes deficient, thereby deteriorating the display quality of the organic EL display device. Also in a passive-matrix organic EL display device, caused is the shortage of lines, and this also deteriorates the display quality of the organic EL display device. Such a problem becomes more apparent when the organic EL display device is large in size. This is because the viewing angle characteristics are expected to be much better but the allowed number of deficits per unit area is reduced.

So far, various attempts have been made to reduce the possibility of causing a short circuit between the first and second electrodes. As an example, Japanese Unexamined Patent Publication No. 2001-035667 describes a technology of providing by insertion a high-resistance layer between an anode electrode and an organic film in an organic EL display device of a bottom emission type. As another example, Japanese Unexamined Patent Publication No. 2006-338916 describes a technology of, in an organic EL display device of a top emission type, configuring an anode electrode to have two layers, and increasing the resistance of one of the layers of the anode electrode closer to an organic layer. As still another example, Japanese Unexamined Patent Publication No. 2005-209647 describes a technology of, in an organic EL display device of a bottom emission type, configuring a cathode electrode to have two layers, and increasing the resistance of one of the layers of the anode electrode closer to an organic layer.

CITATION LIST

Patent Literature

Patent Literature 1: WO 01/39554 pamphlet
Patent Literature 2: Japanese Unexamined Patent Publication No. 2001-035667
Patent Literature 3: Japanese Unexamined Patent Publication No. 2006-338916
Patent Literature 4: Japanese Unexamined Patent Publication No. 2005-209647

SUMMARY OF INVENTION

The concern here is that, as described in these published unexamined patent applications, even if a high-resistance layer is provided by insertion between an anode electrode and a cathode electrode, the problems described above cannot be solved if with the configuration of a resonator. In order to increase the coverage of a high-resistance layer against any particle (foreign substance) or protrusion for the aim of preventing any display defect without fail, there needs to sufficiently increase the film thickness of the high-resistance layer. However, if the high-resistance layer is increased in film thickness, as described above, the viewing angle dependence is resultantly increased.

The present invention is proposed in consideration of such problems, and an object thereof is to provide a light-emitting element and an organic electroluminescent display device that can prevent a possibility of causing a short circuit between first and second electrodes even if there is any particle (foreign substance) or protrusion on the first electrode.

Light-emitting elements in first to fifth aspects of the invention are all share the same configuration of including (A) a first electrode, (B) an organic layer including a light-emitting layer made of an organic light-emitting material, (C) a semi-transmissive/reflective film, (D) a resistance layer, and (E) a second electrode in this order, and in which the first electrode reflects a light coming from the light-emitting layer, and the second electrode passes through a light coming from the semi-transmissive/reflective film after passing therethrough. The light-emitting elements are different from one another in the following respects.

In the light-emitting element in the first aspect, the semi-transmissive/reflective film on the organic layer has an average film thickness in a range from 1 nm to 6 nm.

In the light-emitting element in the second aspect, when a distance from the first interface being an interface between the first electrode and the organic layer to a position on the light-emitting layer where a level of light emission is maximum is $L_1$, an optical distance thereof is $OL_1$, a distance from the second interface being an interface between the semi-transmissive/reflective film and the organic layer (or the third or fourth interface that will be described later) to the position on the light-emitting layer where a level of light emission is maximum is $L_2$, and an optical distance thereof is $OL_2$, expressions (1-1) and (1-2) below are satisfied, $$0.7\{-\phi_1/(2\pi)+m_1\} \leq 2\times OL_1/\lambda \leq 1.2\{-\phi_1/(2\pi)+m_1\} \quad (1\text{-}1)$$

$$0.7\{-\phi_2/(2\pi)+m_2\} \leq 2\times OL_2/\lambda \leq 1.2\{-\phi_2/(2\pi)+m_2\} \quad (1\text{-}2)$$

where $\lambda$ is the maximum peak wavelength in the spectrum of a light generated in the light-emitting layer, $\phi_1$ is an amount of phase shift (unit: radian) of a reflected light generated on the first interface (where $-2\pi<\phi_1\leq 0$)

$\phi_2$ is an amount of phase shift (unit: radian) of a reflected light generated on the second interface (or the third or fourth interface that will be described later) (where $-2\pi<\phi_2\leq 0$), and a value of $(m_1, m_2)$ is (0, 0), (1, 0), or (0, 1).

In the light-emitting element in the third aspect, when an optical distance between a first interface being an interface between the first electrode and the organic layer and a second interface being an interface between the semi-transmissive/reflective film and the organic layer (or the third or fourth interface that will be described later) is L, a sum of phase shift to be observed when the light generated in the light-emitting layer is reflected on the first interface and the second interface (or the third or fourth interface that will be described later) is $\phi$ radian [where $-2\pi<\phi\leq 0$], and the maximum peak wavelength in the spectrum of the light generated in the light-emitting layer is $\lambda$, an expression of $$0.7 \leq \{(2L)/\lambda+\phi/(2\pi)\} \leq 1.3$$

or $$-0.3 \leq \{(2L)/\lambda+\phi/(2\pi)\} \leq 0.3$$

is satisfied.

In the light-emitting element in the fourth aspect, a light generated in the light-emitting layer is made to resonate between a first interface being an interface between the first electrode and the organic layer and a second interface being an interface between the semi-transmissive/reflective film and the organic layer (or the third or fourth interface that will be described later), and a part of the resulting light is emitted from the semi-transmissive/reflective film, the maximum peak wavelength in the spectrum of the light generated in the light-emitting layer is in a range from 600 nm to 650 nm, and the organic layer on the first electrode has a film thickness in a range from $1.1\times10^{-7}$ m to $1.6\times10^{-7}$ m.

In the light-emitting element in the fifth aspect, a light generated in the light-emitting layer is made to resonate between a first interface being an interface between the first electrode and the organic layer and a second interface being an interface between the semi-transmissive/reflective film and the organic layer (or the third or fourth interface that will be described later), and a part of the resulting light is emitted from the semi-transmissive/reflective film. The maximum peak wavelength in the spectrum of the light generated in the light-emitting layer is in a range from 500 nm to 550 nm, and the organic layer on the first electrode has a film thickness in a range from $9\times10^{-8}$ m to $1.3\times10^{-7}$ m.

In the light-emitting element in the sixth aspect, a light generated in the light-emitting layer is made to resonate between a first interface being an interface between the first electrode and the organic layer and a second interface being an interface between the semi-transmissive/reflective film and the organic layer (or the third or fourth interface that will be described later), and a part of the resulting light is emitted from the semi-transmissive/reflective film. The maximum peak wavelength in the spectrum of the light generated in the light-emitting layer is in a range from 430 nm to 480 nm, and the organic layer on the first electrode has a film thickness in a range from $6\times10^{-8}$ m to $1.1\times10^{-7}$ m.

An organic electroluminescent display device (organic EL display device) of the invention includes a plurality of organic electroluminescent elements (organic EL elements). The organic El elements each includes (a) a first electrode, (b) an insulation layer including an aperture, and from the bottom portion of the aperture, the first electrode is exposed, (c) an organic layer that is disposed from the above of a portion of the first electrode exposed from the bottom portion of the aperture to a portion of the insulation layer around the aperture, and includes a light-emitting layer made of an organic light-emitting material, (d) a semi-transmissive/reflective film formed at least on the organic layer, (e) a resistance layer covering the semi-transmissive/reflective film, and (f) a second electrode formed on the resistance layer, in this order. In such an organic EL display device, the first electrode reflects a light coming from the light-emitting layer, the second electrode passes through a light coming from the semi-transmissive/reflective film after passing therethrough, and a portion of the semi-transmissive/reflective film on the insulation layer is at least partially discontinuous.

In such an organic EL display device, a plurality of organic EL elements may be arranged in various manners, including stripe arrangement, diagonal arrangement, delta arrangement, or rectangle arrangement.

In the organic EL display device of the invention, a part of the semi-transmissive/reflective film on the insulation layer is at least partially discontinuous, and more specifically, a part of the semi-transmissive/reflective film on the insulation layer may or may not be partially connected to a part of the semi-transmissive/reflective film on the organic layer. Moreover, in a part of the organic EL elements, a part of the semi-transmissive/reflective film on the insulation layer may be partially connected to a part of the semi-transmissive/reflective film on the organic layer, and in the remaining of the organic EL elements, a part of the semi-transmissive/reflective film on the insulation layer may not be connected to a part of the semi-transmissive/reflective film on the organic layer.

In the light-emitting elements in the second to sixth aspects of the invention, or in the organic EL display device of the invention, preferably, the semi-transmissive/reflective film on the organic layer has an average film thickness in a range from 1 nm to 6 nm.

In the light-emitting elements in the first to sixth aspects of the invention including the preferred configuration described above, or the organic EL display device of the invention (hereinafter, these are sometimes collectively referred to simply as "the invention"), the semi-transmissive/reflective film may be made of alloys of magnesium (Mg)-silver (Ag), magnesium (Mg)-calcium (Ca), aluminum (Al), or silver (Ag). Note here that when the semi-transmissive/reflective film is made of alloys of magnesium-silver, the volume ratio between magnesium and silver is exemplified as being Mg:Ag=5:1 to 30:1. When the semi-transmissive/reflective film is made of magnesium-calcium, the volume ratio between magnesium and calcium is exemplified as being Mg:Ca=1:0.1 to 1:0.5. The semi-transmissive/reflective film is generally acknowledged as being a "film" in the organic EL display device, but in some cases, is a mixture of the top layer portion of the organic layer, the lower layer portion of the semi-transmissive/reflective film, and that of the resistance layer, or is a mixture of the top layer portion of the organic layer, magnesium in the semi-transmissive/reflective film, and the resistance layer, and silver particles are scattered therein.

In the invention including the preferred configuration as such, the material configuring the resistance layer is presumed to have the electrical resistivity of $1\times10^6$ Ω·m to $1\times10^{10}$ Ω·m ($1\times10^4$ Ω·cm to $1\times10^8$ Ω·cm), preferably of $1\times10^8$ Ω·m to $1\times10^9$ Ω·m ($1\times10^6$ Ω·cm to $1\times10^7$ Ω·m), and the resistance layer on the organic layer is presumed to have the thickness of 0.1 µm to 2 µm, preferably of 0.3 µm to 1 µm. If this is the case, the resistance layer is desirably made of semiconductor oxide, or the resistance layer is made of niobium oxide ($Nb_2O_5$), titanium oxide ($TiO_2$), molybdenum oxide ($MoO_2$, $MoO_3$), tantalum oxide ($Ta_2O_5$), hafnium oxide (HfO), IGZO, a mixture of niobium oxide and titanium oxide, a mixture of titanium oxide and zinc oxide (ZnO), or a mixture of silicon oxide ($SiO_2$) and stannic oxide ($SnO_2$), or any appropriate combination of these materials. Note that the electrical resistivity of the material configuring the resistance layer may be determined, to be more specific, considering the value of voltage drop observed in the resistance layer while the light-emitting elements or the organic EL elements are being driven. The voltage drop is exemplified as being in the value of 0.05 volts to 1.0 volt.

Alternatively, in the invention including the preferred configuration described above, the resistance layer may be in the lamination configuration including first and second resistance layers disposed one on the other from the side of the organic layer, and the second resistance layer may have the electrical resistivity higher than that of the first resistance layer. Still alternatively, the resistance layer may be in the lamination configuration including first, second, and third resistance layers disposed one on the other from the side of the organic layer, and the second resistance layer may have the electrical resistivity higher than that of the first resistance layer and that of the third resistance layer. In this example, the first and third resistance layers are exemplarily made by a material including zinc oxide, stannic oxide, niobium oxide, titanium oxide, molybdenum oxide, tantalum oxide, a mixture of niobium oxide and titanium oxide, a mixture of titanium oxide and zinc oxide, or a mixture of silicon oxide and stannic oxide, and are exemplarily formed with the partial pressure of oxygen reduced during film formation. The second resistance layer is exemplarily made of a material including niobium oxide, titanium oxide, molybdenum oxide, tantalum oxide, a mixture of niobium oxide and titanium oxide, a mixture of titanium oxide and zinc oxide, or a mixture of silicon oxide and stannic oxide. When the first, second, and third resistance layers are respectively assumed to have the electrical resistivity values of $R_1$(Ω·m), $R_2$(Ω·m), and $R_3$(Ω·m), satisfying the following expressions is preferable, for example.

$$1\times10^{-3} \le R_1/R_2 \le 1\times10^{-1}$$

$$1\times10^{-3} R_3/R_2 1\times10^{-1}$$

By configuring the resistance layer to be in the multilayer configuration as such, the resistance layer and the semi-transmissive/reflective film can get good contact therebetween more than ever. The resistance layer is thus prevented from voltage drop so that the drive voltage can be low.

Alternatively, when the resistance layer is in the lamination configuration including at least the first and second resistance layers, if the efficiency is a high priority, satisfying the following expressions is preferable.

$$-0.6 \le n_0 - n_1 \le 0.4$$

$$0.4 \le n_1 - n_2 \le 0.9$$

where $n_1$ denotes the refractive index of a material configuring the first resistance layer, $n_2$ denotes the refractive index of a material configuring the second resistance layer, and $n_0$ denotes the refractive index of a material configuring the top layer of the organic layer. Alternatively, if the viewing angle is a high priority, satisfying the following expressions is preferable.

$$-0.2 \le n_0 - n_1 \le 0.2$$

$$0.2 \le n_1 - n_2 \le 0.4$$

In this example, the interface between the semi-transmissive/reflective film and the resistance layer is referred to as "third interface", and the interface between the first and second resistance layers is referred to as "fourth interface". Generally, a light generated in the light-emitting layer is made to resonate between a first interface being an interface between the first electrode and the organic layer and a second interface being an interface between the semi-transmissive/reflective film and the organic layer. However, when the semi-transmissive/reflective film is reduced in thickness, this sometimes increases the value of an average light transmittance of the semi-transmissive/reflective film, thereby allowing most of the light generated in the light-emitting layer to pass through the semi-transmissive/reflective film. If this is the case, the light generated in the light-emitting layer is made to resonate between the first interface being an interface between the first electrode and the organic layer, and the third interface being an interface between the semi-transmissive/reflective film and the resistance layer. Alternatively, when the resistance layer is in the multilayer configuration, the light generated in the light-emitting layer is made to resonate between the first interface being an interface between the first electrode and the organic layer, and the fourth interface being an interface between the first and second resistance layers. Still alternatively, the light generated in the light-emitting layer is made to resonate between the first and third interfaces, and the light generated in the light-emitting layer is made to resonate between the first and fourth interfaces.

In the invention including such various preferred structures and configurations described above, when there is any foreign substance or a protrusion on the first electrode, the region closer to the foreign substance or the protrusion is not formed with the semi-transmissive/reflective film, but the resistance layer exists in the region between the portion of the semi-transmissive/reflective film in the periphery of the foreign substance or the protrusion, and the portion of the first electrode under the foreign substance or beneath the protrusion. Herein, the foreign substance (particle) is highly likely to deposit on the first electrode during the formation or transportation of the first electrode and others. On the other hand, the protrusion is formed often during the formation of the first electrode and others.

Moreover, in the invention including such various preferred structures and configurations described above, a light generated in the light-emitting layer is made to resonate between the first interface being an interface between the first electrode and the organic layer and the second interface being an interface between the semi-transmissive/reflective film and the organic layer (or the third or fourth interface described above), and a part of the resulting light is emitted from the semi-transmissive/reflective film.

In such a case, in the light-emitting elements in the first and fourth to sixth aspects of the invention, and in the organic EL display device of the invention, the following expressions (1-1) and (1-2) can be satisfied.

$$0.7\{-\phi_1/(2\pi)+m_1\} \le 2\times OL_1/\lambda \le 1.2\{-\phi_1/(2\pi)+m_1\} \quad (1\text{-}1)$$

$$0.7\{-\phi_2/(2\pi)+m_2\} \leq 2\times OL_2/\lambda \leq 1.2\{-\phi_2/(2\pi)+m_2\} \quad (1\text{-}2)$$

where $L_1$ denotes a distance from the first interface being an interface between the first electrode and the organic layer to a position on the light-emitting layer where a level of light emission is maximum, $OL_1$ denotes an optical distance thereof, and $L_2$ denotes a distance from the second interface being an interface between the semi-transmissive/reflective film and the organic layer (or the third or fourth interface described above) to a position on the light-emitting layer where a level of light emission is maximum, and $OL_2$ denotes an optical distance thereof. Also in the expressions, $\lambda$ is the maximum peak wavelength in the spectrum of a light generated in the light-emitting layer, $\phi_1$ is the amount of phase shift (unit: radian) of a reflected light generated on the first interface [where $-2\pi < \phi_1 \leq 0$]

$\phi_2$ is the amount of phase shift (unit: radian) of a reflected light generated on the second interface (or the third or fourth interface described above) [where $-2\pi < \phi_2 \leq 0$], and the value of $(m_1, m_2)$ is $(0, 0)$, $(1, 0)$, or $(0, 1)$.

Alternatively, in the light-emitting elements in the first and fourth to sixth aspects of the invention, and in the organic EL display device of the invention, an expression of $$0.7 \leq \{(2L)/\lambda + \phi/(2\pi)\} \leq 1.3$$

or $$-0.3 \leq \{(2L)/\lambda + \phi/(2\pi)\} \leq 0.3$$

can be satisfied where $L$ denotes an optical distance between the first interface being an interface between the first electrode and the organic layer and the second interface being an interface between the semi-transmissive/reflective film and the organic layer (or the third or fourth interface described above), $\phi$ radian denotes the sum of phase shift to be observed when the light generated in the light-emitting layer is reflected on the first interface and the second interface (or on the third or fourth interface described above) [where $-2\pi < \phi \leq 0$], and $\lambda$ denotes the maximum peak wavelength in the spectrum of the light generated in the light-emitting layer.

In the invention including the preferred structures and configurations described above, the first electrode desirably has the average light reflectivity of 50% or higher, preferably 80% or higher, and the semi-transmissive/reflective film has the average light transmittance of 50% to 97%, preferably 60% to 97%.

In the invention, the material (light reflective material) of the first electrode (light reflective electrode) that can make the first electrode function as an anode electrode exemplarily includes metals with a high work function such as platinum (Pt), gold (Au), silver (Ag), chromium (Cr), tungsten (W), nickel (Ni), copper (Cu), iron (Fe), cobalt (Co), tantalum (Ta), and others, or alloys (e.g., alloys of Ag—Pd—Cu including silver as a main component, 0.3 weight percent to 1 weight percent of palladium (Pd), and 0.3 weight percent to 1 weight percent of copper (Cu), and alloys of Al—Nd). Moreover, when used is a conductive material having a low work function and a high light reflectivity such as aluminum (Al) and alloys of aluminum, the first electrode can serve as an anode electrode if the characteristics of hole injection are improved by the provision of any appropriate hole injection layer, for example. The first electrode has the thickness of 0.1 µm to 1 µm, for example. In an alternative configuration, a reflective film showing the satisfactory characteristics of light reflection such as dielectric multilayer film or film made of aluminum (Al) may be provided thereon with a transparent conductive material showing the superior characteristics of hole injection such as indium tin oxide (ITO) or indium zinc oxide (IZO). On the other hand, in order to make the first electrode function as a cathode electrode, desirably, the material for use is a conductive material having a low work function, and a high light reflectivity. Alternatively, the first electrode can be used as a cathode electrode if the characteristics of electron injection are improved by any appropriate electron injection layer provided to any conductive material with a high light reflectivity that is used for an anode electrode, for example.

On the other hand, the material (semi-transmissive material) configuring the second electrode of the invention that can make the second electrode function as a cathode electrode desirably includes a conductive material that has a low work function so as to allow transmission of light generated in the light-transmitting layer, and injection of electrons with good efficiency to the organic layer. Such a material is exemplified by alloys of magnesium-silver, metals including aluminum, silver, calcium, strontium, and others, or alloys thereof. As an alternative configuration, a so-called transparent electrode material such as ITO or IZO may be provided with any appropriate electron injection layer to improve the characteristics of electron injection. The second electrode exemplarily has the thickness of $2\times10^{-9}$ m to $5\times10^{-8}$ m, preferably of $3\times10^{-9}$ m to $2\times10^{-8}$ m, and more preferably of $5\times10^{-9}$ m to $1\times10^{-8}$ m. Still alternatively, the second electrode may be reduced in resistance in its entirety by providing thereto a bus electrode (auxiliary electrode) made of a low-resistance material. Note here that in order to make the second electrode function as an anode electrode, desirably, the material for use is a conductive material with a high work function that allows transmission of a light generated in the light-emitting layer.

The first and second electrodes, and the semi-transmissive/reflective film are each made by evaporation methods including electron beam evaporation, hot filament evaporation, and vacuum evaporation, sputtering, chemical vapor deposition (CVD), a combination of ion plating and etching; various printing methods including screen printing, inkjet printing, metal mask printing, and others, plating (electroplating and electroless plating); lift-off; laser ablation; zol-gel; and others. By using such various methods of printing and plating, the first and second electrodes, and the semi-transmissive/reflective film can be made directly into any desired shape (pattern). Note that for forming the first and second electrodes after forming the organic layer, in view of protecting the organic layer from any possible damages, preferable methods used as a basis for film formation include a film-forming method especially like vacuum evaporation with which the energy of particles is small in the formed film, or a film-forming method such as MOCVD. Also for forming the semi-transmissive/reflective film, in view of protecting the organic layer from any possible damages and providing any discontinuous portion, preferable methods used as a basis for film formation include a method especially like vacuum evaporation with which the energy of particles is small in the formed film, and with which the coverage is poor. If the organic layer suffers from damages, there is a possibility of generating a no-light emitting pixel (or no-light emitting sub pixel) called "dark dot" due to the generation of a leakage current. In view of protecting the organic layer from deterioration due to moisture in the air, preferably, the procedure starting from the formation of the organic layer to the formation of these electrodes and others is carried out with no exposure to the air. The second electrode may be or may not be electrically connected to the semi-transmissive/reflective film.

The resistance layer, and the first, second, and third resistance layers are preferably each formed by any film-forming method with which the coverage is satisfactory, e.g., sputtering, CVD, ion plating, and others.

The first electrode and the semi-transmissive/reflective film each partially absorb an incoming light, and reflect the remaining of the light. As a result, a phase shift occurs in the reflected light. The amount of this phase shift $\phi_1$ and $\phi_2$ is determined by a calculation based on measurement values using an ellipsometer, for example. The measurement values include values of real part and imaginary part of a complex refractive index for the material configuring the first electrode, and those for the material configuring the semi-transmissive/reflective film (as an example, refer to "Principles of Optic", Max Bornard Emil Wolf, 1974 (PERGAMON PRESS). Note that the refractive index of any other layers including the organic layer and the second electrode can be determined by measurement also using an ellipsometer.

The organic layer is provided with a light-emitting layer made of an organic light-emitting material, and specifically, can be in the lamination configuration including a hole transport layer, the light-emitting layer, and an electron transport layer, in the lamination configuration including a hole transport layer, and the light-emitting layer serving also as an electron transport layer, and in the lamination configuration including a hole injection layer, a hole transport layer, the light-emitting layer, an electron transport layer, and an electron injection layer. For forming such an organic layer, possible methods include physical vapor deposition (PVD) such as vacuum evaporation; printing methods including screen printing and inkjet printing; laser transfer methods, and various methods of coating. With the laser transfer methods, the lamination configuration of a laser absorption layer and an organic layer formed on a substrate for transfer use is exposed to laser radiation to separate the organic layer from the laser absorption layer therebelow, and the organic layer is then transferred. For forming the organic layer based on vacuum evaporation, for example, a so-called metal mask may be used, and any material passing through the aperture formed on this metal mask may be accumulated, thereby forming the organic layer.

Herein, in the invention, the hole transport layer (hole supply layer) preferably has the thickness substantially the same as that of the electron transport layer (electron supply). Alternatively, the electron transport layer (electron supply layer) may be thicker than the hole transport layer (hole supply layer), and if this is the case, the light-emitting layer can be supplied with electrons in amount necessary to achieve a higher efficiency with a low drive voltage, and electrons sufficient in amount. In other words, the supply of holes can be increased with such a configuration that the hole transport layer is disposed between the first electrode serving as the anode electrode and the light-emitting layer, and the hole transport layer is formed to be thinner in film thickness than the electron transport layer. This accordingly leads to the carrier balance with which the holes and electrons are both just enough in amount, and the supply of carrier is sufficiently large in amount so that the efficiency of light emission can be high. What is more, since the holes and electrons are both just enough in amount, the carrier balance is not lost that easily, any possible deterioration by driving can be prevented, and the light-emitting life can be increased.

In the invention, a plurality of light-emitting elements or organic EL elements are each formed on the first substrate or thereabove. In this example, the first or second substrate is exemplified by a glass substrate with a high strain point, a soda-lime glass ($Na_2O.Ca.O.SiO_2$) substrate, a borosilicate glass ($Na_2O.B_2O_3.SiO_2$) substrate, a forsterite ($2MgO.SiO_2$) substrate, a lead glass ($Na_2O.PbO.SiO_2$) substrate, various types of glass substrates each formed with an insulation film on the surface, a quartz substrate, a quartz substrate formed with an insulation film on the surface, a silicon substrate formed with an insulation film on the surface, and an organic polymer exemplified by polymethyl methacrylate (polymethyl methacrylate, PMMA), polyvinyl alcohol (PVA), polyvinyl phenol (PVP), polyether sulfone (PES), polyimide, polycarbonate, polyethylene terephthalate (PET), and others. The organic polymer is in the form of a high polymer material such as plastic film, plastic sheet, plastic substrate, and others each made of a high polymer material with flexibility. However, in the organic EL display device of a bottom emission type that will be described later, the first substrate is required to be transparent with respect to a light each coming from the light-emitting elements. The first and second substrates may be made from the same material or not.

The first electrode is provided on an inter-layer insulation layer, for example. This inter-layer insulation layer is covering a light-emitting element drive section formed on the first substrate. The light-emitting element drive section is configured by one or more thin film transistors (TFTs), and the TFT(s) and the first electrode are electrically connected to each other through a contact plug provided to the inter-layer insulation layer. As the material configuring the inter-layer insulation layer, an insulative resin such as $SiO_2$ material; SiN material, and polyimide can be used individually or in combination as appropriate. The $SiO_2$ material includes $SiO_2$, BPSG, PSG, BSG, AsSG, PbSG, SiON, SOG (spin-on glass), glass with a low melting point, glass paste, and others. For forming the inter-layer insulation layer, various known processes can be used such as CVD, coating, sputtering, and various printing methods. In the organic EL display device of a bottom emission type that will be described later, the inter-layer insulation layer is required to be made of any material transparent with respect to a light each coming from the light-emitting elements, and the light-emitting element drive section is required to be configured not to block the lights from the light-emitting elements. On the other hand, the insulation layer formed on the inter-layer insulation layer is preferably made of an insulation material having satisfactory flatness, and being low in water absorption for the aim to protect the organic layer from any possible deterioration due to moisture, and to keep the intensity level of light emission. To be specific, such a material is exemplified by polyimide resin. When the second electrode is provided with a bus electrode (auxiliary electrode) made of a low-resistance material, the bus electrode (auxiliary electrode) is preferably disposed at such a position that the projected image of the bus electrode (auxiliary electrode) comes in the projected image of the insulation layer.

In the organic EL display device of the invention, the configuration includes the second substrate fixed above the second electrode. Note that the organic EL display device of such a configuration is sometimes referred to as "organic EL display device of a top emission type" for convenience. Alternatively, the configuration may include the first substrate fixed below the second electrode. Note that the organic EL display device of such a configuration is sometimes referred to as "organic EL display device of a bottom emission type" for convenience. In such an organic EL display device of a top emission type, between the second electrode and the second substrate, a protection film and an adhesive layer (sealing layer) are formed from the side of the second electrode. Herein, as a material configuring the protection film, the preferable material includes the one being transparent with respect to the light generated in the light-emitting layer, being dense, and not allowing the moisture to pass therethrough. Such a material is specifically exemplified by amorphous silicon ($\alpha$-Si), amorphous silicon carbide ($\alpha$-SiC), amorphous silicon nitride (α-Si$_{1-x}$N$_x$), amorphous silicon oxide (α-Si$_{1-y}$O$_y$), amorphous carbon (α-C), amorphous silicon oxide/nitride (α-SiON), and Al$_2$O$_3$. The material configuring the adhesive layer (sealing layer) is exemplified by thermosetting adhesive including acrylic adhesive, epoxy adhesive, urethane adhesive, silicone adhesive, and cyanoacrylate adhesive, and ultraviolet curing adhesive. Note that, also in the organic EL display device of a bottom emission type, the second substrate is disposed above the second electrode, and between the first and second substrates, the protection film and the adhesive layer described above are formed from the side of the first electrode.

For the purpose of preventing any moisture from reaching the organic layer, the organic layer is provided thereabove with the protection film having the characteristics of insulation or conductivity as described above. The protection film is preferably formed specifically by any film-forming method such as vacuum evaporation with the small energy of particles in the resulting film, or based on CVD because this does not affect the base that much. Alternatively, for preventing any possible reduction of the intensity due to the deterioration of the organic layer, the protection film is preferably formed with the settings of a film-forming temperature to be at the room temperature, and under the conditions of minimizing the stress to be imposed on the protection film in order to protect the protection film from any possible exfoliation. Also, the protection film is preferably formed without exposing the already-formed electrodes to the air, and by doing so, the organic layer can be protected from any possible deterioration due to the moisture and oxygen in the air. Moreover, when the organic EL display device is of a top emission type, the protection film is preferably made of a material that allows 80% or more of the light generated in the organic layer to pass therethrough, and specifically, such a material includes an inorganic amorphous insulating material, e.g., the materials described above. Since such an inorganic amorphous insulating material does not generate any grain, the resulting protection film can be satisfactory with a low permeability. Note that when the protection film is made of a conductive material, the protection film may be made of a transparent conductive material such as ITO and IZO.

When the organic EL display device of the invention is an organic EL display device of color display, the organic El elements configuring such an organic EL display device each configure a sub pixel. Herein, one pixel is configured by three types of sub pixels, including a red light-emitting sub pixel that emits a light of red (configured by the light-emitting element in the fourth aspect of the invention), a green light-emitting sub pixel that emits a light of green (configured by the light-emitting element in the fifth aspect of the invention), and a blue light-emitting sub pixel that emits a light of blue (configured by a light-emitting element in the sixth aspect of the invention). Accordingly, assuming that the organic EL display device includes N×M pieces of organic EL elements, the number of pixels is (N×M)/3. Alternatively, the organic EL display device of the invention is available for use as a backlight device for a liquid crystal display device, or a lighting fixture including a planar light source.

The second and first substrates allowing the light coming from the light-emitting elements to pass therethrough may be formed with a color filer or a light shielding film (black matrix) if required.

In some cases, the resistance layer may be varied in electrical resistance value depending on which part of the resistance layer is positioned above which sub pixel, i.e., the part of the resistance layer positioned above the red light-emitting sub pixel may have the electrical resistance value R$_R$, the part of the resistance layer positioned above the green light-emitting sub pixel may have the electrical resistance value R$_G$, and the part of the resistance layer positioned above the blue light-emitting sub pixel may have the electrical resistance value R$_B$. In other words, expressions of $$R_B > R_G$$

$$R_B > R_R$$

may be satisfied, for example. In order to vary R$_B$, R$_G$, and R$_R$ as such, the resistance layer may be varied in thickness depending on which part of the resistance layer is positioned above which sub pixel, i.e., the part of the resistance layer positioned above the red light-emitting sub pixel, the part of the resistance layer positioned above the green light-emitting sub pixel, and the part of the resistance layer positioned above the blue light-emitting sub pixel, for example. Alternatively, the resistance layer may be made of different types of material depending on which part of the resistance layer is positioned above which sub pixel, i.e., the part of the resistance layer positioned above the red light-emitting sub pixel, the part of the resistance layer positioned above the green light-emitting sub pixel, and the part of the resistance layer positioned above the blue light-emitting sub pixel. Still alternatively, the resistance layer may be varied in content of substance contributing to the resistance layer in terms of conductivity depending on which part of the resistance layer is positioned above which sub pixel, i.e., the part of the resistance layer positioned above the red light-emitting sub pixel, the part of the resistance layer positioned above the green light-emitting sub pixel, and the part of the resistance layer positioned above the blue light-emitting sub pixel.

In some cases, an extraction electrode may be provided to the outer peripheral region of the organic EL display device for connecting the second electrode to any external circuit. In this example, the outer peripheral region of the organic EL display device is a region enclosing a display region like a frame, and the display region is a region located substantially in the center for fulfilling the function of practical image display as the organic EL display device. The extraction electrode is disposed to the first or second substrate, and may be configured by a so-called metal film with a high melting point such as titanium (Ti) film, molybdenum (Mo) film, tungsten (W) film, tantalum (Ta) film, and others. The connection between the second electrode and the extraction electrode may be established by forming an extraction section of the second electrode on the extraction electrode, for example. For forming the extraction electrode, the same methods as described above for forming the first and second electrodes may be used.

In the light-emitting element in the first aspect of the invention, or in the organic EL display device of the invention, the organic layer is sandwiched between the first electrode and the semi-transmissive/reflective film, and is in the configuration of a resonator. Above the organic layer, the resistance layer is formed, and on the resistance layer, the second electrode is formed. Herein, in the light-emitting element in the first aspect of the invention, the semi-transmissive/reflective film on the organic layer has the average film thickness of 1 nm to 6 nm. Such a semi-transmissive/reflective film very thin in thickness may be generally at least partially discontinuous. As such, even if the organic layer fails to provide the full coverage due to a foreign substance (particle) or a protrusion on the first electrode or due to any height difference, the second electrode never fails to apply voltage to the organic layer, and thanks to the existence of the resistance layer, there is no possibility of causing a short circuit between the first and second electrodes, and the first electrode does not come in contact with the semi-transmissive/reflective film. What is more, in the organic EL display device of the invention, the semi-transmissive/reflective film on the insulation layer is at least partially discontinuous. Accordingly, even if the organic layer fails to provide the full coverage due to a foreign substance or a protrusion on the first electrode or due to any height difference, the second electrode also never fails to apply voltage to the organic layer, and thanks to the existence of the resistance layer, there is no possibility of causing a short circuit between the first and second electrodes, and the first electrode does not come in contact with the semi-transmissive/reflective film.

Also in the light-emitting elements in the second to sixth aspects of the invention, the organic layer is sandwiched between the first electrode and the semi-transmissive/reflective film, and is in the configuration of a resonator. Above the organic layer, the resistance layer is formed, and on the resistance layer, the second electrode is formed. Herein, even if the organic layer fails to provide the full coverage due to a foreign substance or a protrusion on the first electrode or due to any height difference, the second electrode never fails to apply voltage to the organic layer, and thanks to the existence of the resistance layer, there is no possibility of causing a short circuit between the first and second electrodes. Also in the light-emitting elements in the second and third aspects of the invention, the conditions of interference of light or resonance thereof are defined by the organic layer, the first electrode, and the semi-transmissive/reflective film in each of the light-emitting elements, and in the light-emitting elements in the fourth to sixth aspects of the invention, restrictions are applied to the maximum peak wavelength in the spectrum of the light generated in the light-emitting layer, and to the film thickness of the organic layer on the first electrode. Therefore, the viewing angle dependence of luminance and chromaticity can be reduced to a considerable degree.

What is more, in the light-emitting elements in the first to sixth aspects of the invention, or in the organic EL display device of the invention, as to the characteristics of the light-emitting elements or those of the organic EL elements, the same level of reliability as that of the previous light-emitting elements or that of the organic EL elements can be ensured because the semi-transmissive/reflective film is configured by Mg—Ag or others that is used in the previous organic EL elements, and the second electrode is provided separately from the semi-transmissive/reflective film.

DESCRIPTION OF EMBODIMENTS

In the below, by referring to the accompanying drawings, the present invention is described based on embodiments. Herein, the invention is not restricted to the following embodiments, and various numerical values and materials are only examples.

First Embodiment

Figure 1:
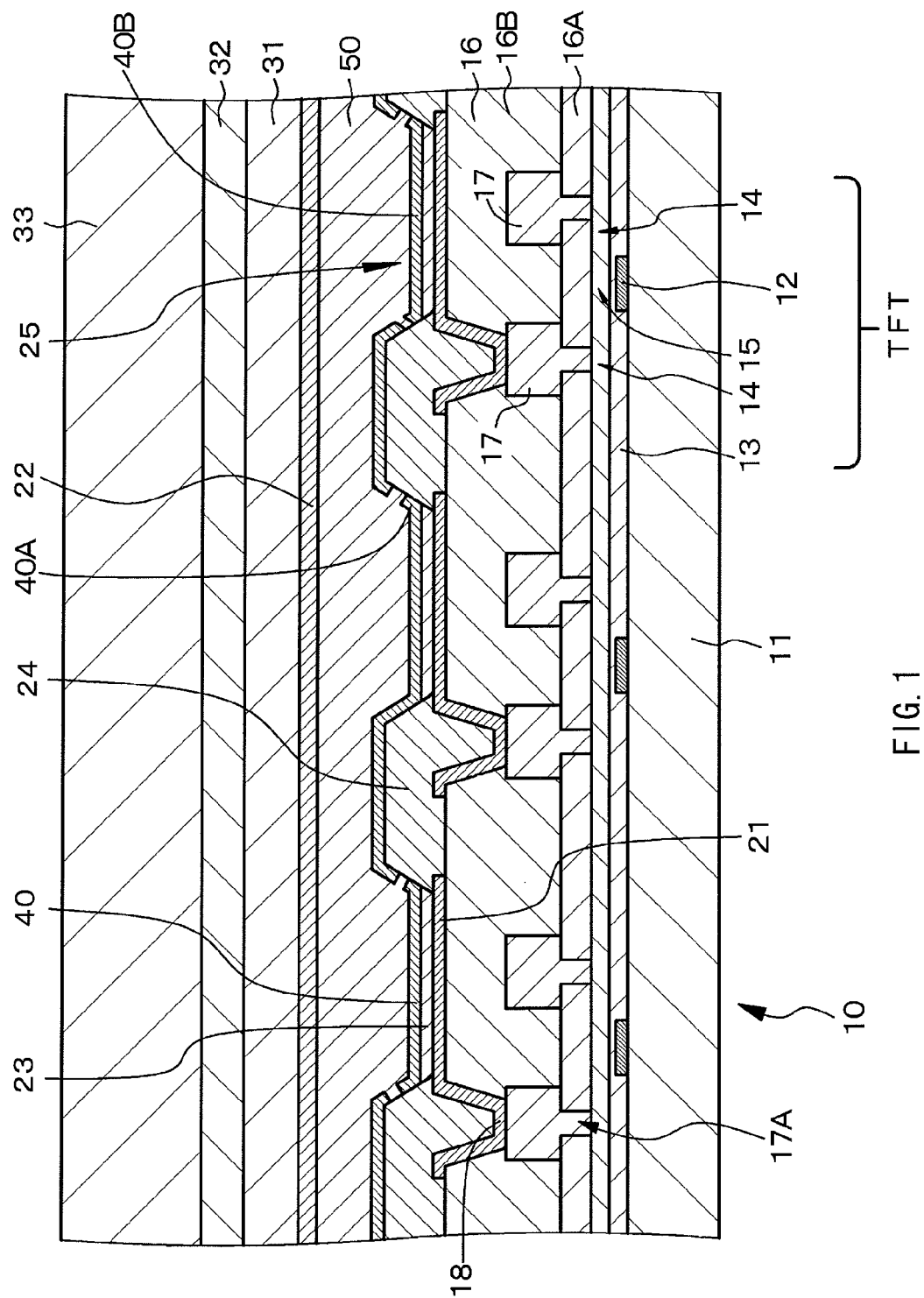
FIG. 1 is a schematic partial cross sectional view of an organic electroluminescent display device in a first example.
Figure 2:
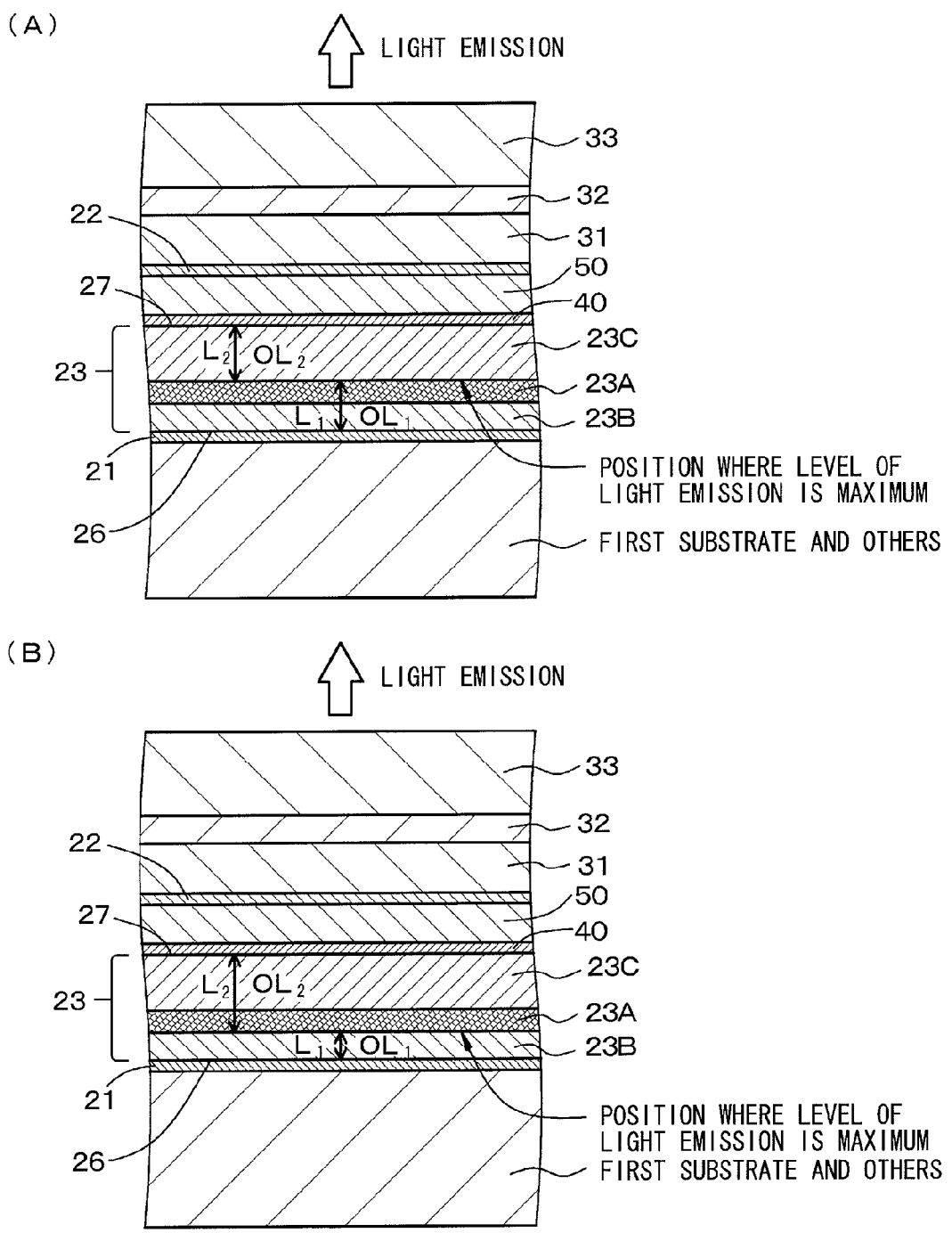
FIGS. 2(A) and (B) are each a schematic view of an organic layer or others in the organic electroluminescent display device in the first example.

A first embodiment is related to light-emitting elements in first to sixth aspects of the invention, and to an organic EL display device of the invention. FIG. 1 shows a schematic partial cross sectional view of the organic EL display device of the first embodiment, and FIGS. 2(A) and (B) each show a schematic view of an organic layer or others. The organic EL display device of the first embodiment is an active-matrix organic EL display device for color display, and is of a top emission type. In other words, through a second electrode, and also through a second substrate, a light is emitted.

The organic EL display device of the first embodiment includes a plurality of (e.g., N×M=2880×540) light-emitting elements (to be specific, organic EL elements) 10. Note that one light-emitting element (organic EL element) 10 configures one sub pixel. Accordingly, the organic EL display device includes (N×M)/3 pixels. Herein, one pixel is configured by three types of sub pixels, including a red light-emitting sub pixel that emits a light of red (configured by the light-emitting element in the fourth aspect of the invention), a green light-emitting sub pixel that emits a light of green (configured by the light-emitting element in the fifth aspect of the invention), and a blue light-emitting sub pixel that emits a light of blue (configured by the light-emitting element in the sixth aspect of the invention).

As shown in FIG. 1 and FIGS. 2(A) and (B), the light-emitting element (organic EL element) in the first embodiment is expressed as the one including, in this order, (A) a first electrode 21,
(B) an organic layer 23 including a light-emitting layer 23A made of an organic light-emitting material,
(C) a semi-transmissive/reflective film 40,
(D) a resistance layer 50, and
(E) a second electrode 22 based on the light-emitting elements in the first to sixth aspects of the invention. In this example, the first electrode 21 reflects a light coming from the light-emitting layer 23A, and the second electrode 22 passes through the light coming from the semi-transmissive/reflective film 40 after passing therethrough.

Moreover, the organic EL display device in the first embodiment is provided with a plurality of organic EL elements each including (a) the first electrode 21,
(b) an insulation layer 24 formed with an aperture 25, and from the bottom portion of the aperture 25, the first electrode 21 is exposed,
(c) the organic layer 23 provided from the above of the portion of the first electrode 21 exposed from the bottom portion of the aperture 25 to the portion of the insulation layer 24 around the aperture 25, and is provided with the light-emitting layer 23A made of an organic light-emitting material,
(d) the semi-transmissive/reflective film 40 formed at least on the organic layer 23,
(e) the resistance layer 50 covering the semi-transmissive/reflective film 40, and
(f) the second electrode 22 formed on the resistance layer 50.

Herein, in the first embodiment, the first electrode 21 is used as an anode electrode, and the second electrode 22 is used as a cathode electrode. To be specific, the first electrode 21 is made of a light reflective material such as alloys of Al—Nd with a thickness of 0.2 μm, the second electrode 22 is made of a transparent conductive material such as ITO or IZO with a thickness of 0.1 μm, and the semi-transmissive/reflective film 40 is made of a conductive material including magnesium (Mg), and more specifically, is made of alloys of Mg—Ag with a thickness of 5 nm. The first electrode 21 patterned in any predetermined shape is formed based on a combination of vacuum evaporation and etching. On the other hand, the second electrode 22 and the semi-transmissive/reflective film 40 are both formed by a film-forming method especially like vacuum evaporation with which the energy of particles is small in the formed film, and with which the coverage is poor. The second electrode 22 and the semi-transmissive/reflective film 40 are not both patterned, and are each shaped like a sheet. Note that, between the organic layer 23 and the semi-transmissive/reflective film 40, formed is an electron injection layer (not shown) made of Lif with a thickness of 0.3 nm. Table 2 in the below shows the measurement result for the first and second electrodes 21 and 22 in terms of refractive index, the measurement result for the first electrode 21 in terms of light reflectivity, and the measurement result for the semi-transmissive/reflective film 40 in terms of light transmittance. Herein, the measurement results are those derived with the wavelength of 530 nm.

In the first embodiment, the insulation layer 24 is made of an insulation material, specifically polyimide resin having satisfactory flatness, and being low in water absorption for the aim to protect the organic layer 23 from any possible deterioration due to moisture, and to keep the intensity level of light emission. The organic layer 23 is in the lamination configuration including a hole transport layer, and a light-emitting layer serving also as an electron transport layer, for example, but in the drawing, may be shown by one layer.

In the first embodiment, the first electrode 21 configuring the organic EL element is provided on an inter-layer insulation layer 16 (more specifically, an upper inter-layer insulation layer 16B) made of $SiO_2$ and formed based on CVD. This inter-layer insulation layer 16 is covering an organic EL element drive section formed on a first substrate 11 made of soda-lime glass. The organic EL element drive section is configured by a plurality of TFTs, and these TFTs and the first electrode 21 are electrically connected together through a contact plug 18, a wiring pattern 17, and a contact plug 17A all provided on the inter-layer insulation layer (to be more specific, the upper inter-layer insulation layer 16B). Note that, in the drawing, one TFT is shown for one organic EL element drive section. The TFTs are each configured by a gate electrode 12 formed on the first substrate 11, a gate insulation film 13 formed on the first substrate 11 and the gate electrode 12, a source/drain region 14 provided on a semiconductor layer formed on the gate insulation film 13, and a channel forming region 15 between the source/drain regions 14, corresponding to a portion of the semiconductor layer located above the gate electrode 12. Note that, in the example shown in the drawing, the TFTs are exemplified as each being a bottom gate type, but may be each a top gate type. The gate electrode 12 of each of the TFTs is connected to a scan circuit (not shown).

In the first embodiment, on the second electrode 22, for the purpose of preventing any moisture from reaching the organic layer 23, an insulative protection film 31 made of amorphous silicon nitride ($Si_{1-x}N_x$) is provided based on plasma CVD. On the protection film 31, a second substrate 33 made of soda-lime glass is disposed. The protection film 31 and the second substrate 33 are attached together by an adhesive layer 32 made of acrylic adhesive. Table 2 below shows the measurement result for the protection film 31 and the adhesive layer 32 in terms of refractive index. Herein, the refractive index is the measurement result with the wavelength of 530 nm.

In summary, the detailed configuration of the light-emitting element in the first embodiment is as shown in Table 1 below.

TABLE 1

| | |
|---|---|
| Second substrate 33: | soda-lime glass |
| Adhesive layer 32: | acrylic adhesive |
| Protection layer 31: | $SiN_x$ layer (thickness: 5 μm) |
| Second electrode (Cathode electrode) 22: | ITO layer (thickness: 0.1 μm) |
| Resistance layer 50: | $Nb_2O_5$ layer (thickness: 0.5 μm) |
| Semi-transmissive/reflective film 40: | Mg—Ag layer (thickness: 5 nm) |
| Electron injection layer: | LiF layer (thickness: 0.3 nm) |
| Organic layer 23: | will be described later |
| First electrode (anode electrode) 21: | Al—Nd layer (thickness: 0.2 μm) |
| Inter-layer insulation layer 16: | $SiO_2$ layer |
| TFT: | configuring organic EL element drive section |
| First substrate 11: | soda-lime glass |

TABLE 2

| Refractive index of First electrode 21 | |
|---|---|
| Real Part: | 0.755 |

TABLE 2-continued

| | |
|---|---|
| Imaginary Part: | 5.466 |
| Refractive index of Semi-transmissive/reflective film 40 | |
| Real Part: | 0.617 |
| Imaginary Part: | 3.904 |
| Refractive index of Second Electrode 22 | |
| Real Part: | 1.814 |
| Imaginary Part: | 0 |
| Refractive index of Resistance Layer 50 | |
| Real Part: | 2.285 |
| Imaginary Part: | 0 |
| Refractive index of Protection Film 31 | |
| Real Part: | 1.87 |
| Imaginary Part: | 0 |
| Refractive index of Adhesive Layer 32 | |
| Real Part: | 1.53 |
| Imaginary Part: | 0 |
| Light Reflectivity of First Electrode 21: | 85% |
| Light Reflectivity of Semi-transmissive/reflective film 40: | 79% |
| Light Reflectivity of Second Electrode 22: | 2% |

In the light-emitting element in the first embodiment, in the expression based on the light-emitting element in the first aspect of the invention, the semi-transmissive/reflective film 40 on the organic layer 23 has the average film thickness of 1 nm to 6 nm (to be specific, 5 nm in the first embodiment).

In the organic EL display device in the first embodiment, a portion 40A of the semi-transmissive/reflective film 40 is at least partially discontinuous on the insulation layer 24.

Herein, although the portion 40A of the semi-transmissive/reflective film is at least partially discontinuous on the insulation layer 24, the portion 40A of the semi-transmissive/reflective film on the insulation layer 24 is partially connected to a portion 40B of the semi-transmissive/reflective film on the organic layer 23. In some cases, the portion 40A of the semi-transmissive/reflective film on the insulation layer 24 is not connected to the portion 40B of the semi-transmissive/reflective film on the organic layer 23. Alternatively or in some cases, in a part of the organic EL elements, the portion 40A of the semi-transmissive/reflective film 40 on the insulation layer 24 is partially connected to the portion 40B of the semi-transmissive/reflective film 40 on the organic layer 23, and in the remaining of the organic EL elements, the portion 40A of the semi-transmissive/reflective film 40 on the insulation layer 24 is not partially connected to the portion 40B of the semi-transmissive/reflective film 40 on the organic layer 23. Herein, the portion 40A of the semi-transmissive/reflective film 40 on the insulation layer 24 has the average film thickness thinner than that of the portion 40B of the semi-transmissive/reflective film 40 on the organic layer 23. As such, by configuring the portion 40B of the semi-transmissive/reflective film 40 on the organic layer 23 to have the average film thickness of 1 nm to 6 nm, the portion 40A of the semi-transmissive/reflective film 40 on the insulation layer 24 is made discontinuous without fail.

A light emitted in the light-emitting layer 23A is made to resonate between first and second interfaces 26 and 27, and a part of the resulting light is emitted from the semi-transmissive/reflective film 40. The first interface 26 is an interface between the first electrode 21 and the organic layer 23, and the second interface 27 is an interface between the semi-transmissive/reflective film 40 and the organic layer 23.

In such a light-emitting element in the first embodiment, in the expression based on the light-emitting element in the second aspect of the invention, or in the expression based on the preferred structure in the first aspect of the invention, based on the preferred structure in the light-emitting elements in the fourth to sixth aspects of the invention, and based on the preferred structure in the organic EL display device of the invention, as shown in FIGS. 2(A) and (B), the following expressions (1-1) and (1-2) are satisfied, where $L_1$ denotes a distance from the first interface 26 being an interface between the first electrode 21 and the organic layer 23 to a position on the light-emitting layer 23A where the level of light emission is maximum, $OL_1$ denotes an optical distance thereof, $L_2$ denotes a distance from the second interface 27 being an interface between the semi-transmissive/reflective film 40 and the organic layer 23 to a position on the light-emitting layer 23A where the level of light emission is maximum, and $OL_2$ denotes an optical distance thereof.

$$0.7\{-\phi_1/(2\pi)+m_1\} \leq 2 \times OL_1/\lambda \leq 1.2\{-\phi_1/(2\pi)+m_1\} \quad (1\text{-}1)$$

$$0.7\{-\phi_2/(2\pi)+m_2\} \leq 2 \times OL_2/\lambda \leq 1.2\{-\phi_2/(2\pi)+m_2\} \quad (1\text{-}2)$$

In these expressions, $\lambda$ is the maximum peak wavelength in the spectrum of a light generated in the light-emitting layer 23A, $\phi_1$ is the amount of phase shift (unit: radian) of a reflected light generated on the first interface 26 [where $-2\pi < \phi_1 \leq 0$]

$\phi_2$ is the amount of phase shift (unit: radian) of a reflected light generated on the second interface 27 [where $-2\pi < \phi_2 \leq 0$], and the value of $(m_1, m_2)$ is $(0, 0)$ in the first embodiment.

Moreover, in the light-emitting element in the first embodiment, in the expression based on the light-emitting element in the third aspect of the invention, or in the expression based on the preferred structure in the first aspect of the invention, based on the preferred structure of the light-emitting elements in the fourth to sixth aspects of the invention, and based on the preferred structure of the organic EL display device of the invention, the following expression is satisfied.

$$-0.3 \leq \{(2L)/\lambda + \phi/(2\pi)\} \leq 0.3,$$

where L denotes an optical distance between the first interface 26 being an interface between the first electrode 21 and the organic layer 23 and the second interface 27 being an interface between the semi-transmissive/reflective film 40 and the organic layer 23, $\phi$ radian denotes the sum of phase shift to be observed when the light generated in the light-emitting layer 23A is reflected on the first and second interfaces 26 and 27 [where $-2\pi < \phi \leq 0$], and $\lambda$ denotes the maximum peak wavelength in the spectrum of the light generated in the light-emitting layer 23A.

In the first embodiment, the organic layers 23 are each configured, specifically, by a red light-emitting organic layer in a red light-emitting organic EL element (the light-emitting element in the fourth aspect of the invention) configuring a red light-emitting sub pixel, a green light-emitting organic layer in a green light-emitting organic EL element (the light-emitting element in the fifth aspect of the invention) configuring a green light-emitting sub pixel, and a blue light-emitting organic layer in a blue light-emitting organic EL element (the light-emitting element in the sixth aspect of the invention) configuring a blue light-emitting sub pixel. Such a plurality of organic EL elements are arranged in various manners, including stripe arrangement, diagonal arrangement, delta arrangement, or rectangle arrangement.

The light-emitting element in the fourth aspect of the invention serving as a red light-emitting organic EL element is operated to resonate a light generated in the light-emitting layer 23A, and to emit a part of the resulting light from the semi-transmissive/reflective film 40. The light is made to resonate between the first interface 26 being an interface between the first electrode 21 and the organic layer 23, and the second interface 27 being an interface between the semi-transmissive/reflective film 40 and the organic layer 23. In this case, the maximum peak wavelength in the spectrum of the light generated in the light-emitting layer 23A is of 600 nm to 650 nm (specifically 620 nm in the first embodiment), and the organic layer 23 on the first electrode 21 has the film thickness of $1.1 \times 10^{-7}$ m to $1.6 \times 10^{-7}$ m (specifically, 150 nm in the first embodiment).

To be specific, the red light-emitting organic layer has the configuration as shown in Table 3 below. The position for the maximum level of light emission is on the interface between the electron transport layer and the light-emitting layer (refer to (A) in FIG. 2). Note that, in Table 3 or in Tables 4 and 5 that will be described later, the closer the column to the bottom means that the layer is closer to the first electrode.

TABLE 3

|  | Material | Film Thickness |
|---|---|---|
| Electron Transport Layer | Idemitsu Kosan, Co., Ltd.: ET085 | 60 nm |
| Light-emitting Layer | Idemitsu Kosan, Co., Ltd.: RH001 + Toray Industries, Inc.: D125 (0.5% dope) | 50 nm |
| Hole Transport Layer | Idemitsu Kosan, Co., Ltd.: HT320 | 20 nm |
| Hole Injection Layer | LG Chem, Ltd.: LGHIL | 10 nm |

Further, the light-emitting element in the fifth aspect of the invention serving as a green light-emitting organic EL element is operated to resonate a light generated in the light-emitting layer 23A, and to emit a part of the resulting light from the semi-transmissive/reflective film 40. The light is made to resonate between the first interface 26 being an interface between the first electrode 21 and the organic layer 23, and the second interface 27 being an interface between the semi-transmissive/reflective film 40 and the organic layer 23. In this case, the maximum peak wavelength in the spectrum of the light generated in the light-emitting layer 23A is of 500 nm to 550 nm (specifically 530 nm in the first embodiment), and the organic layer 23 on the first electrode 21 has the thickness of $9 \times 10^{-8}$ m to $1.3 \times 10^{-7}$ m (specifically, 118 nm in the first embodiment).

To be specific, the green light-emitting organic layer has the configuration as shown in Table 4 below. Note that the position for the maximum level of light emission is on the interface between the electron transport layer and the light-emitting layer (refer to (B) in FIG. 2).

TABLE 4

|  | Material | Film Thickness |
|---|---|---|
| Electron Transport Layer | Idemitsu Kosan, Co., Ltd.: ETS085 | 30 nm |
| Light-emitting Layer | Idemitsu Kosan, Co., Ltd.: BH232 + GD206 (10% dope) | 30 nm |
| Hole Transport Layer | Idemitsu Kosan, Co., Ltd.: HT320 | 48 nm |
| Hole Injection Layer | LG Chem, Ltd.: LGHIL | 10 nm |

Still further, the light-emitting element in the sixth aspect of the invention serving as a blue light-emitting organic EL element is operated to resonate a light generated in the light-emitting layer 23A, and to emit a part of the resulting light from the semi-transmissive/reflective film 40. The light is made to resonate between the first interface 26 being an interface between the first electrode 21 and the organic layer 23, and the second interface 27 being an interface between the semi-transmissive/reflective film 40 and the organic layer 23. In this case, the maximum peak wavelength in the spectrum of the light generated in the light-emitting layer 23A is of 430 nm to 480 nm (specifically 460 nm in the first embodiment), and the organic layer 23 on the first electrode 21 has the film thickness of $6 \times 10^{-8}$ m to $1.1 \times 10^{-7}$ m (specifically, 88 nm in the first embodiment).

To be specific, the blue light-emitting organic layer has the configuration as shown in Table 5 below. Note that the position for the maximum level of light emission is on the interface between the electron transport layer and the light-emitting layer (refer to (B) in FIG. 2).

TABLE 5

|  | Material | Film Thickness |
|---|---|---|
| Electron Transport Layer | Idemitsu Kosan, Co., Ltd.: ET085 | 20 nm |
| Light-emitting Layer | Idemitsu Kosan, Co., Ltd.: BH232 + BD218 (10% dope) | 30 nm |
| Hole Transport Layer | Idemitsu Kosan, Co., Ltd.: HT320 | 28 nm |
| Hole Injection Layer | LG Chem, Ltd.: LGHIL | 10 nm |

In the first embodiment, the semi-transmissive/reflective film 40 with the thickness of 5 nm is made of alloys of magnesium (Mg)-silver (Ag), and the volume ratio between magnesium and silver is Mg:Ag=10:1. The resistance layer 50 is made of niobium oxide ($Nb_2O_5$) having the electrical resistivity of $1 \times 10^8$ Ω·m ($1 \times 10^6$ Ω·cm), and the resistance layer 50 above the organic layer 23 has the thickness of 0.5 μm.

In such a resistance layer 50, the voltage drop is observed as below. In this example, the second electrode 22 and the resistance layer 50 are assumed as each having the following specifications as below.

[Second Electrode 22]
Electrical resistivity ($\rho_1$): $3.0 \times 10^{-4}$ Ω·cm
Film thickness ($d_1$): 0.1 μm
Current density flowing through second electrode 22 ($J_1$): 10 mA/cm$^2$

[Resistance layer 50]
Electrical resistivity ($\rho_2$): $1.0 \times 10^4$ Ω·cm to $1.0 \times 10^6$ Ω·cm
Film thickness ($d_2$): 0.5 μm
Current density flowing through resistance layer 50 ($J_2$): 10 mA/cm$^2$ Sheet resistance of second electrode $22 = (\rho_1/d_1) = 30$ Ω/□
Sheet resistance of resistance layer $50 = (\rho_2/d_2) = 2 \times 10^8$ Ω/□ to $2 \times 10^{10}$ Ω/□

Voltage drop in second electrode $22 = \rho_1 \times d_1 \times J_1 = 3.0 \times 10^{-11}$ V Voltage drop in resistance layer $50 = \rho_2 \times d_2 \times J_2 = 5$ mV to 500 mV As described above, when the resistance layer 50 is made of $Nb_2O_5$, the voltage drop in the resistance layer 50 is estimated as being about 0.5 volt at the maximum, and this is not a value of voltage drop that will cause any specific problem for the driving of the organic EL elements or the organic EL display device.

Table 6 below exemplarily shows the values of λ, $L_1$, $OL_1$, $2OL_1/\lambda$, $L_2$, $OL_2$, $2OL_2/\lambda$, $n_{ave}$, $\{-2\phi_1/(2\pi)+m_1\}$, and $\{-2\phi_2/(2\pi)+m_2\}$ in the red light-emitting organic layer, the green light-emitting organic layer, and the blue light-emitting organic layer. Herein, $m_1=0$, and $m_2=0$.

TABLE 6

| | Unit | Red Light-emitting Organic Layer | Green Light-emitting Organic Layer | Blue Light-emitting Organic Layer |
|---|---|---|---|---|
| $\lambda$ | nm | 620 | 530 | 460 |
| $L_1$ | nm | 80 | 58 | 38 |
| $OL_1$ | nm | 144 | 110 | 75.2 |
| $2OL_1/\lambda$ | | 0.465 | 0.416 | 0.327 |
| $L_2$ | nm | 60 | 60 | 50 |
| $OL_2$ | nm | 107 | 109 | 93.8 |
| $2OL_2/\lambda$ | | 0.345 | 0.410 | 0.408 |
| $n_{ave}$ | | 1.793 | 1.854 | 1.920 |
| $-\phi_1/(2\pi) + m_1$ | | 0.399 | 0.380 | 0.357 |
| $-\phi_2/(2\pi) + m_2$ | | 0.369 | 0.361 | 0.352 |

Figure 3:
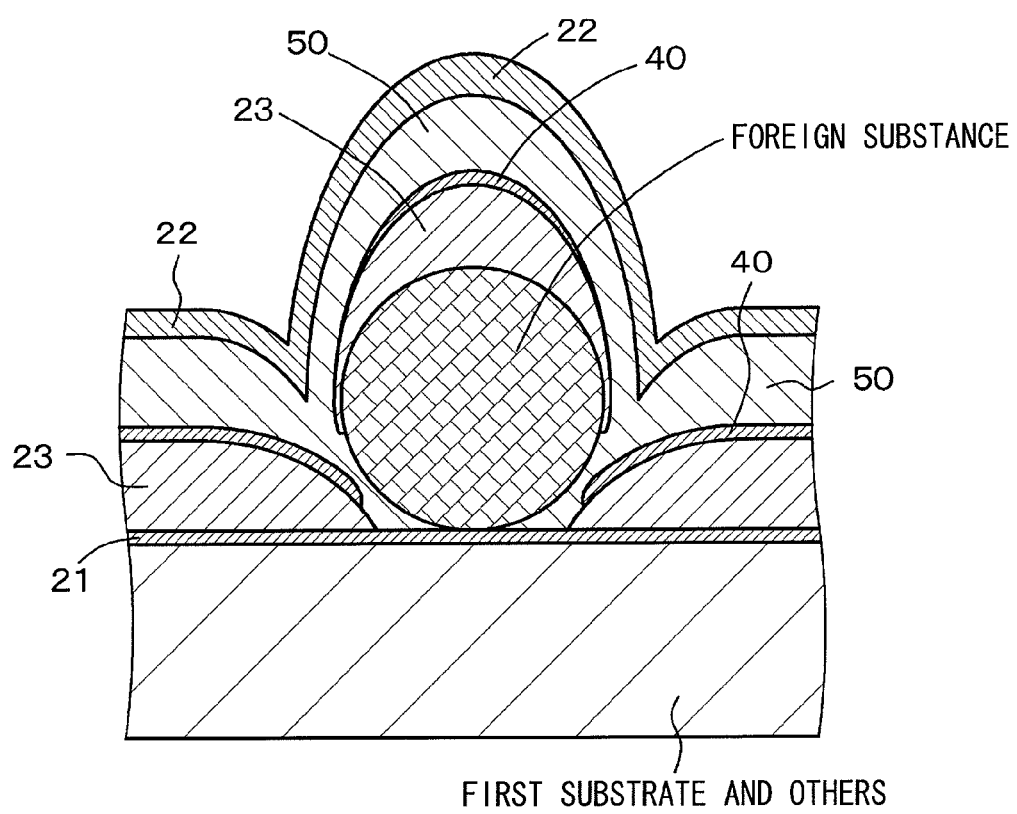
FIG. 3 is a partial cross sectional view of the organic electroluminescent display device in the first example, schematically showing the state of film formation of an organic layer or others when there is any foreign substance on a first electrode.

Some foreign substance (particle) is often deposited on the first electrode 21 during the formation and transportation of the first electrode 21 and others. Also during the formation of the first electrode 21, the first electrode 21 is often formed with a protrusion(s). Moreover, during the formation of the organic layer 23, a height difference(s) are generated. With such a foreign substance(s) and protrusion(s), as is schematically shown in FIG. 3, the organic layer 23 fails to provide the perfect coverage. Due to the semi-transmissive/reflective film 40 formed on the organic layer 23 to be very thin as 1 nm to 6 nm in thickness, the first electrode 21 is formed thereon with a foreign substance(s) or a protrusion(s). Also when there is any height difference, in the vicinity of a foreign substance(s), a protrusion(s), or a height difference(s), during the formation of the semi-transmissive/reflective film 40, a sort of "separation due to height difference" is caused, and thus the semi-transmissive/reflective film 40 is not formed in the vicinity of the foreign substance(s), the protrusion(s), or the height difference(s). Since the resistance layer 50 is then formed in such a state, the resistance layer exists in the region between the portion of the semi-transmissive/reflective film 40 in the periphery of the foreign substance(s) or the protrusion(s), and the portion of the first electrode 21 under the foreign substance(s) or beneath the protrusion(s).

Figure 4:
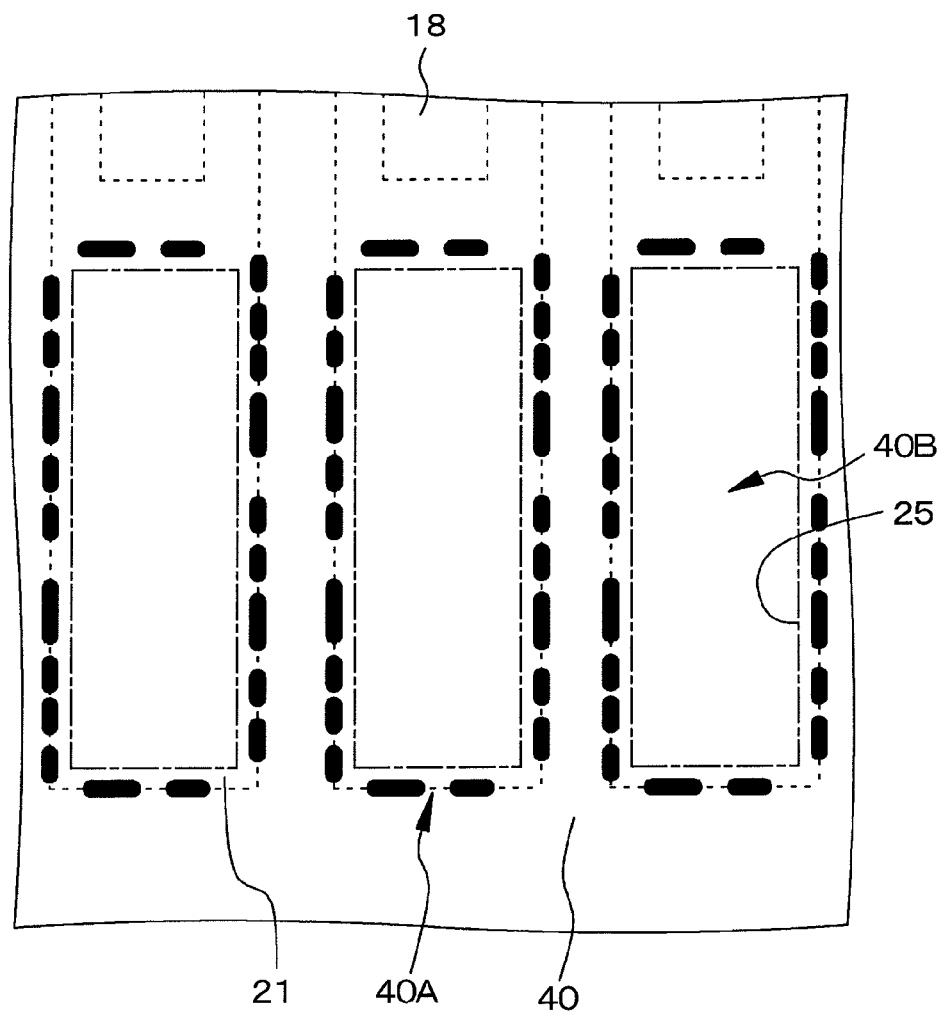
FIG. 4 is a diagram showing schematic layout of the organic layer or others in the organic electroluminescent display device in the first example.

Moreover, as described above, since the portion 40B of the semi-transmissive/reflective film 40 on the organic layer 23 is formed so as to have the average film thickness of 1 nm to 6 nm, the portion 40A of the semi-transmissive/reflective film 40 on the insulation layer 24 becomes discontinuous. To be more specific, the organic layer 23 including the light-emitting layer 23A is provided from the above of the portion of the first electrode 21 exposed from the bottom portion of the aperture 25 to the portion of the insulation layer 24 around the aperture 25, and the semi-transmissive/reflective film 40 is also provided from the above of the organic layer 23 to the portion of the insulation layer 24 around the aperture 25. Herein, the portion of the insulation layer 24 around the aperture 25 is sloped down toward the aperture 25. As such, the portion 40A of the semi-transmissive/reflective film 40 above the portion of the insulation layer 24 around the aperture 25 has the film thickness thinner than that of the portion 40B of the semi-transmissive/reflective film 40 on the organic layer 23. Therefore, the portion 40A of the semi-transmissive/reflective film 40 on the portion of the insulation layer 24 around the aperture 25 becomes discontinuous (in pieces). Such a state is schematically shown in FIG. 4, and therein, the discontinuous portions of the semi-transmissive/reflective film 40 are filled in with black. Also therein, the contact plug 18 and the first electrode 21 are each indicated by dotted lines, and the edge portion of the aperture 25 is indicated by alternate long and short dashed lines. In FIG. 4, such discontinuous portions are shown as being located at regular intervals, but actually, the discontinuous portions are located not at regular intervals.

When a voltage is applied to the first and second electrodes 21 and 22 for driving the light-emitting elements, thanks to the existence of the resistance layer 50 between the first and second electrodes 21 and 22, there is no possibility of causing a short circuit between the first and second electrodes 21 and 22 even if there is any foreign substance or protrusion, and the first electrode 21 does not come in contact with the semi-transmissive/reflective film 40, thereby being able to prevent, without fail, a possibility of any defective pixels and the shortage of lines. Note that, when the first electrode 21 comes in contact with the semi-transmissive/reflective film 40, the first electrode 21 reaches the same potential as the semi-transmissive/reflective film 40 so that the light-emitting layer 23 stops emitting light.

In the below, by referring to FIGS. 5(A) to (C), FIGS. 6(A) and (B), and FIGS. 7(A) and (B), described are the outlines of a manufacturing method of the organic EL display device of the first embodiment.

[Step-100]

First of all, on the first substrate 11, a TFT is manufactured to each sub pixel with any known method. The TFT is configured so as to include the gate electrode 12 formed on the first substrate 11, the gate insulation film 13 formed on the first substrate 11 and the gate electrode 12, the source/drain region 14 provided on a semiconductor layer formed on the gate insulation film 13, and the channel forming region 15 between the source/drain regions 14, corresponding to a portion of the semiconductor layer located above the gate electrode 12. Herein, in the shown example, the TFT is exemplified as being of a bottom gate type, but may be of a top gate type. In the TFT, the gate electrode 12 is connected to a scan circuit (not shown). Next, on the first substrate 11, a lower inter-layer insulation layer 16A made of $SiO_2$ is formed by CVD so as to cover the TFT, and based on the techniques of photo lithography and etching, the resulting lower inter-layer insulation layer 16A is formed with an aperture 16' (refer to FIG. 5(A)).

[Step-110]

Next, on the lower inter-layer insulation layer 16A, the wiring pattern 17 made of aluminum is formed based on the technique in combination of vapor deposition and etching. Note that the wiring pattern 17 is electrically connected to the source/drain area 14 of the TFT through the contact plug 17A provided inside of the aperture 16'. The wiring pattern 17 is connected to a signal supply circuit (not shown). Thereafter, the upper inter-layer insulation layer 16B made of $SiO_2$ is formed entirely thereover by CVD. Next, based on the techniques of photo lithography and etching, an aperture 18' is formed on the upper inter-layer insulation layer 16B (refer to FIG. 5(B)).

[Step-120]

Figure 5:
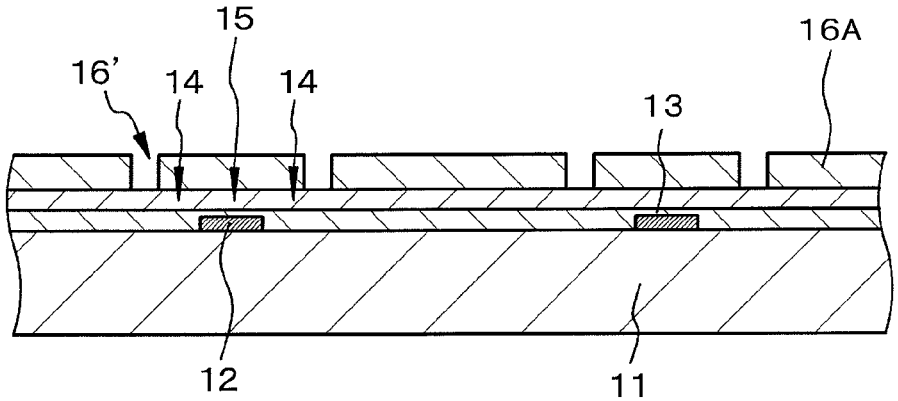
FIGS. 5(A), (B), and (C) are each a schematic view of a first substrate or others showing a partial end surface thereof for illustrating the outlines of a manufacturing method of the organic electroluminescent display device in the first example.
Figure 5:
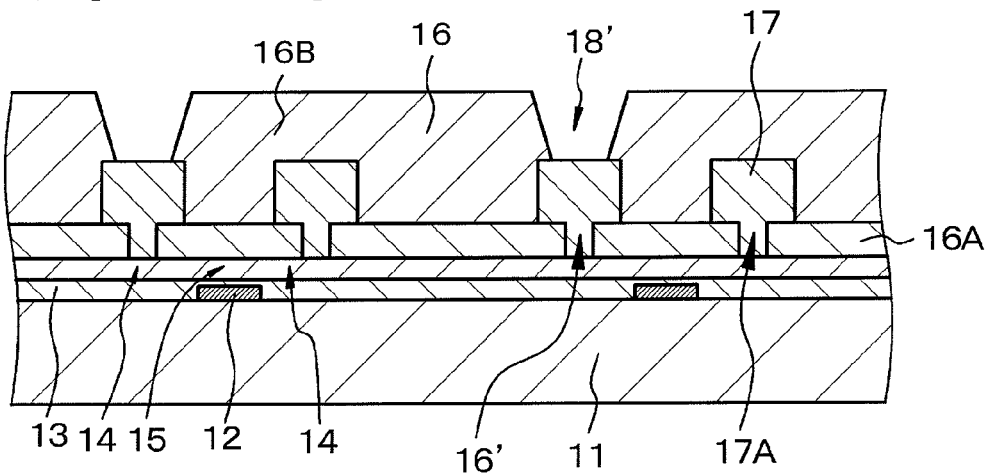
Figure 5:
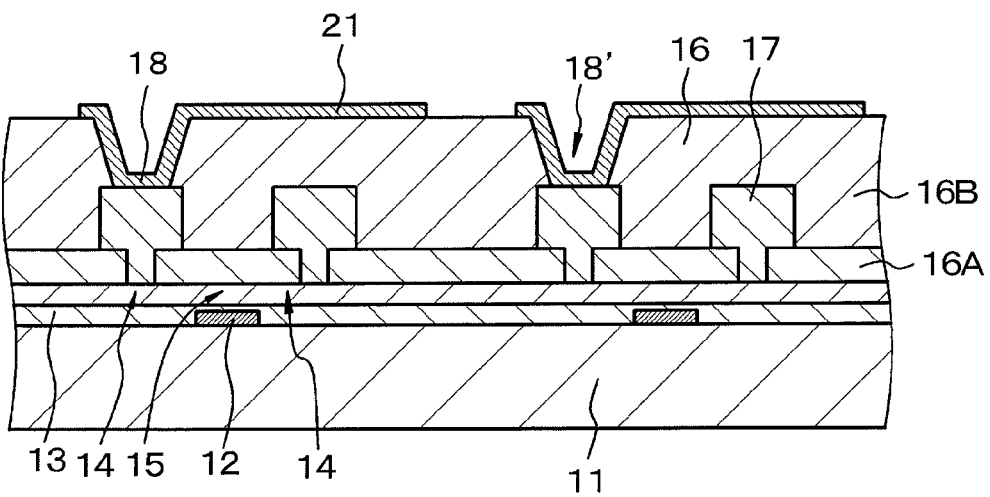

Thereafter, on the upper inter-layer insulation layer 16B, based on the technique in combination of vacuum evaporation and etching, the first electrode 21 made of alloys of Al—Nd is formed (refer to FIG. 5(C)). Note here that the first electrode 21 is electrically connected to the wiring pattern 17 through the contact plug 18 provided inside of the aperture 18'.

[Step-130]

Figure 6:
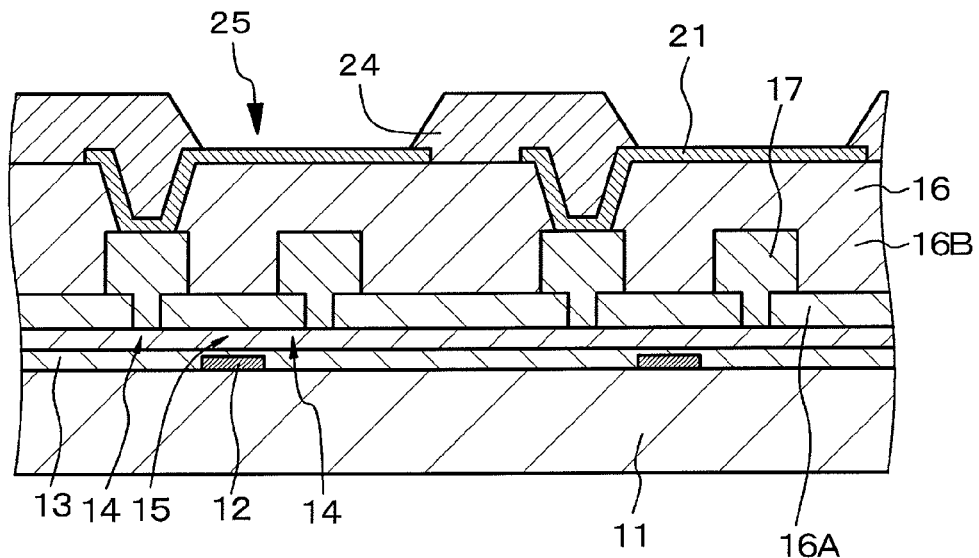
FIGS. 6(A) and (B) are each another schematic view of the first substrate or others showing the partial end surface thereof for illustrating the outlines of the manufacturing method of the organic electroluminescent display device in the first example subsequent to that in FIG. 5(C).
Figure 6:
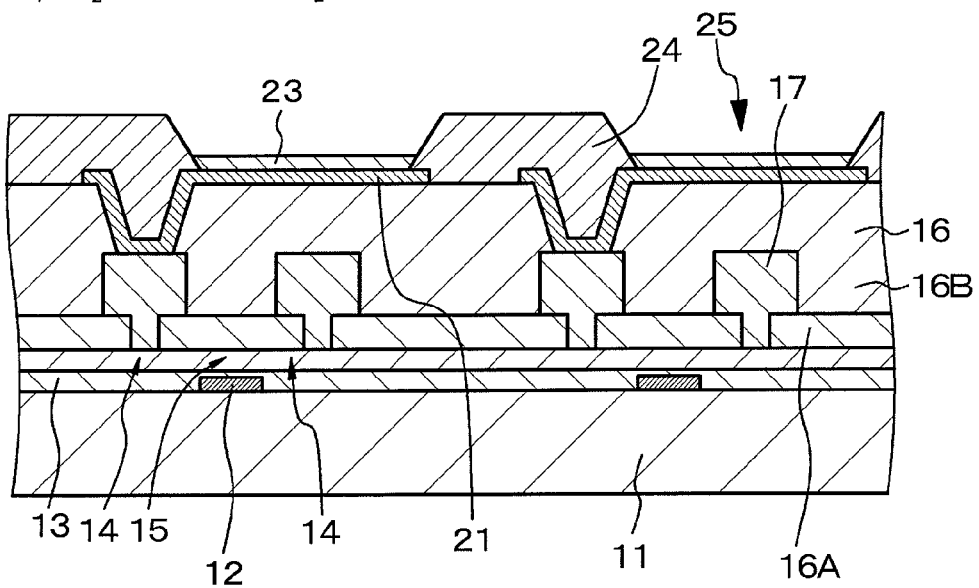

Next, on the inter-layer insulation layer 16 including the first electrode 21, formed is the insulation layer 24 formed with the aperture 25, and from the bottom portion of the aperture 25, the first electrode 21 is exposed (refer to FIG. 6(A)). To be specific, based on the techniques of spin coating and etching, the insulation 24 made of polyimide resin is formed with a thickness of 1 μm on the inter-layer insulation layer 16, and on the portion around the first electrode 21. Note that the portion of the insulation layer 24 around the aperture 25 is preferably sloped gradually.

[Step-140]

Next, the organic layer 23 is formed from the above of the portion of the first electrode 21 exposed from the bottom portion of the aperture 25 to the portion of the insulation layer 24 around the aperture 25 (refer to FIG. 6(B)). Note that the organic layer 23 is in the lamination configuration including, in order, a hole transport layer made of an organic material, and a light-emitting layer serving also as an electron transport layer. To be specific, by using the insulation layer 24 as a sort of spacer, and in the state that a metal mask (not shown) for the use to form the organic layer 23 configuring each sub pixel on the insulation layer 24 is disposed on a protrusion of the insulation layer 24, the organic material is subjected to vapor deposition based on resistance heating. The organic material passes through an aperture formed on the metal mask, and from the above of the portion of the first electrode 21 exposed from the bottom portion of the aperture 25 configuring the sub pixels, is accumulated over the portion of the insulation layer 24 around the aperture 25.

[Step-150]

Figure 7:
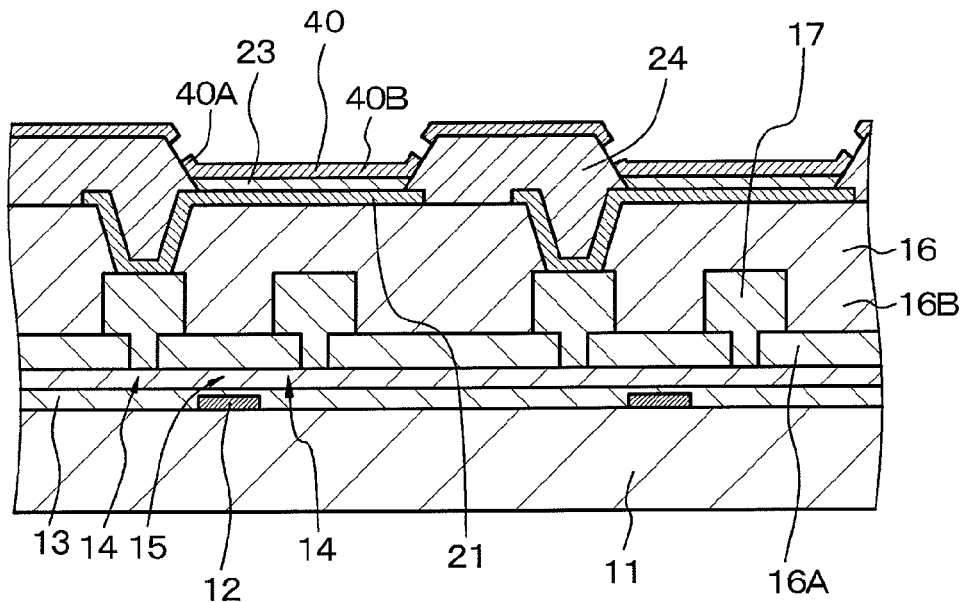
FIGS. 7(A) and (B) are each still another schematic view of the first substrate or others showing the partial end surface thereof for illustrating the outlines of the manufacturing method of the organic electroluminescent display device in the first example subsequent to that in FIG. 6(B).
Figure 7:
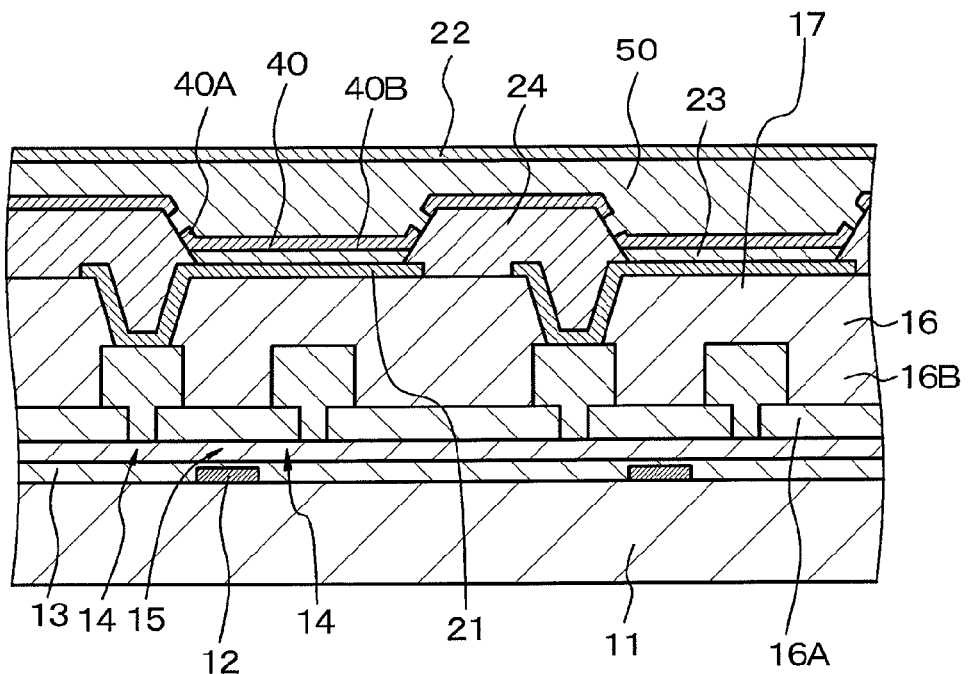

Thereafter, entirely over the display region, the semi-transmissive/reflective film 40 is formed so as to have the average film thickness of 5 nm on the organic layer 23 (refer to FIG. 7(A)). The semi-transmissive/reflective film 40 is covering the entire surface of the organic layer 23 configuring N×M pieces of organic EL elements. Note that, as already described above, the portion 40A of the semi-transmissive/reflective film 40 on the insulation layer 24 becomes at least partially discontinuous. The semi-transmissive/reflective film 40 is formed by vapor deposition being a film-forming method with which the energy of particles is small enough in the formed film not to affect the organic layer 23, and with which the coverage is poor. Also, without exposing the organic layer 23 to the air, by forming the semi-transmissive/reflective film 40 in a vacuum deposition chamber used for forming the organic layer 23 successively thereafter, the organic layer 23 can be protected from any possible deterioration due to the moisture and oxygen in the air. To be specific, by forming a co-deposited film made of Mg—Ag (volume ratio of 10:1), the semi-transmissive/reflective film 40 can be produced. Note here that, for forming the semi-transmissive/reflective film 40, the poor coverage is preferable considering to make it discontinuous in state. In consideration thereof, the pressure during the film formation is preferably low, and desirably $1 \times 10^{-3}$ Pa or lower, for example.

[Step-160]

Next, by sputtering, formed is the resistance layer 50 made of niobium oxide ($Nb_2O_5$) having the electrical resistivity of $1 \times 10^8$ Ω·m ($1 \times 10^6$ Ω·cm), and with a thickness of 0.5 μm above the organic layer 23. Although the resulting resistance layer 50 comes in contact with the second electrode 22, if the resistance value can be increased, and if the current flowing through the resistance layer 50 can be suppressed to 1/10 or lower of the entire current flowing through one sub pixel, even if the state of FIG. 3 is observed, this is not acknowledged as missing pixels or defects such as dark dots in the display image. When the resistance layer 50 is made of $Nb_2O_5$, the characteristics required for the resistance layer 50 are calculated as above, and the electrical resistivity of $1 \times 10^6$ Ω·m to $1 \times 10^8$ Ω·m is preferable. Moreover, considering the coverage by the shape constraints during the formation of the resistance layer 50, the pressure during the film formation is preferably high, and desirably is of 0.1 Pa to 10 Pa. Moreover, when the resistance layer 50 is made of oxide semiconductor, the resistance layer 50 may sometimes show a change of electrical resistivity depending on the oxygen content (the partial pressure of oxygen) during the film formation. However, when the resistance layer 50 is made of $Nb_2O_5$, even if the oxygen content shows a change during the film formation (specifically, even if the partial pressure of oxygen shows a change from $1 \times 10^{-4}$ Pa to $1 \times 10^{-2}$ Pa), the change is within the range from $1 \times 10^6$ Ω·m to $1 \times 10^8$ Ω·m ($1 \times 10^4$ Ω·cm to $1 \times 10^6$ Ω·cm) so that the electrical resistivity can be stable.

[Step-170]

Thereafter, the second electrode 22 is formed entirely over the display region (refer to FIG. 7(B)). The second electrode 22 is covering the entire surface of the organic layer 23 configuring the N×M pieces of organic EL elements. Note here that the second electrode 22 is insulated from the first electrode 21 by the resistance layer 50, the organic layer 23, and the insulation layer 24. The second electrode 22 is also formed by magnetron sputtering being a film-forming method with which the energy of particles is small enough in the formed film not to affect the organic layer 23. Also, without exposing the organic layer 23 to the air, by forming the second electrode 22 in a vacuum deposition chamber used for forming the organic layer 23 successively thereafter, the organic layer 23 can be protected from any possible deterioration due to the moisture and oxygen in the air. To be specific, by forming an ITO layer with a thickness of 0.1 μm entirely thereover, the second electrode 22 can be produced.

[Step-180]

Next, on the second electrode 22, an insulative protection film 31 made of amorphous silicon nitride ($Si_{1-x}N_x$) is formed based on plasma CVD. By forming the protection layer 31 one after another without exposing the second electrode 22 to the air, the organic layer 23 can be protected from any possible deterioration due to the moisture and oxygen in the air. Thereafter, the protection film 31 and the second substrate 33 are attached together by the adhesive layer 32 made of acrylic adhesive. Lastly, by establishing a connection with an external circuit(s), the manufacturing of the organic EL display device is completed.

For the purpose of assessment, six prototypes of organic EL display devices each including 460000 pixels are produced, and the sum of the missing pixels (dark dots) in these six prototypes is calculated. The calculation result is as shown in Table 7.

For a comparison purpose, six prototypes of organic EL display devices are produced, in each of which a semi-transmissive/reflective film and a resistance layer are not provided, and the organic layer 23 is formed thereon directly with a second electrode made of Mg—Ag with a thickness of 10 nm (except that the semi-transmissive/reflective film and the resistance layer are not provided, and except that the second electrode is in the different configuration, the remaining structure and configuration is the same as the organic EL display device in the first embodiment), and the sum of the missing pixels (dark dots) in these six prototypes is calculated as a comparative example 1A. The calculation result is as shown in Table 7. Also six other prototypes of organic EL display devices are produced, in each of which a resistance layer is not provided, and the organic layer 23 is formed thereon with a semi-transmissive/reflective film and a second electrode made of Mg—Ag with a thickness of 10 nm (except that the resistance layer is not provided, the remaining structure and configuration is the same as the organic EL display device in the first embodiment), and the sum of the missing pixels (dark dots) in these six prototypes is calculated as a comparative example 1B. The calculation result is as shown in Table 7. As is known from Table 7, in comparison with the previous organic EL display device, the number of missing pixels is considerably reduced in the organic EL display device in the first embodiment. Moreover, for the experimental purpose, after [Step-150], [Step-180] is carried out without going through [step-160] and [Step-170], and the prototypes of organic EL display devices are produced. Thereafter, by using the semi-transmissive/reflective film having a thickness of 5 nm as a second electrode, an assessment is made as to the state of light emission in each of the prototypes of organic EL display devices. However, the assessment result shows that the state of light emission is not satisfactory. In other words, the semi-transmissive/reflective film with a thickness of 5 nm is found as not being continuous but is at least partially discontinuous.

TABLE 7

| First Embodiment | 4 pieces |
|---|---|
| Comparative example 1A | 36 pieces |
| Comparative example 1B | 267 pieces |

Note that, instead of configuring the semi-transmissive/reflective film using alloys of magnesium (Mg)-silver (Ag), the film may also be configured using magnesium (Mg)-calcium (Ca). To be specific, the volume ratio between magnesium and calcium is Mg:Ca=9:1, and the resulting semi-transmissive/reflective film has the thickness of 2 nm. Such a semi-transmissive/reflective film can be produced by vapor deposition.

Second Embodiment

A second embodiment is a modification of the first embodiment, and therein, a resistance layer is in the lamination configuration including first and second resistance layers from the side of an organic layer, and the second resistance layer has the electrical resistivity higher than that of the first resistance layer. In this second embodiment, the first and second resistance layers are both made of $Nb_2O_5$, and by changing the partial pressure of oxygen during the film formation by sputtering using $Nb_2O_5$, the first and second resistance layers respectively have the values of electrical resistivity $R_1$ and $R_2$ as below.

Electrical resistivity $R_1$ of First resistance layer: $1\times10^6 \Omega \cdot m$ ($1\times10^4 \Omega \cdot cm$)

Electrical resistivity $R_2$ of Second resistance layer: $1\times10^8 \Omega \cdot m$ ($1\times10^6 \Omega \cdot cm$)

When the resistance layer is measured for a voltage drop therein, in comparison with the measurement result of voltage drop in a resistance layer configured by a single layer (electrical resistivity: $1\times10^8 \Omega \cdot m$ ($1\times10^6 \Omega \cdot cm$), in the second embodiment, the voltage drop is small in value so that the drive voltage can be favorably reduced. Note that the sum of the missing pixels (dark dots) is the same as that in the first embodiment.

Except that the resistance layer is in the different configuration, in the second embodiment, the organic EL display device, the light-emitting element, and the organic EL element can respectively have the same structure and configuration as the organic EL display device, the light-emitting element, and the organic EL element in the first embodiment, and thus a detailed description is not given again.

Third Embodiment

A third embodiment is also a modification of the first embodiment. In the first embodiment, the part of the resistance layer positioned above the red light-emitting sub pixel may have the electrical resistance value (electrical resistance value per unit area of the resistance layer. The same is applicable to below) $R_R$, which is the same as the electrical resistance value $R_G$ of the part of the resistance layer positioned above the green light-emitting sub pixel, and as the electrical resistance value $R_B$ of the part of the resistance layer positioned above the blue light-emitting sub pixel. In other words, the entire surface is covered uniformly by the resistance layer. Herein, generally, the blue light-emitting sub pixel with a short wavelength of light emission has the optical distance $L_B$ shorter than optical distances $L_G$ and $L_R$ respectively for the green light-emitting sub pixel and the red light-emitting sub pixel each with a longer wavelength of light emission. Therefore, there needs to reduce the thickness of the organic layer in the blue light-emitting sub pixel to be thinner than the thickness of the organic layer in the green light-emitting sub pixel and that in the red light-emitting sub pixel. This resultantly increases the possibility of causing a short circuit especially between the first and second electrodes in the blue light-emitting sub pixel, and thus the resistance layer in the blue light-emitting sub pixel is required to be the thickest among all. On the other hand, having a dependency on the material configuring each of the light-emitting sub pixels, and a dependency on the film thickness of the organic layer, generally, the blue light-emitting sub pixel, the green light-emitting sub pixel, and the red light-emitting sub pixel have different values of drive voltage in ascending order of value, i.e., the blue light-emitting sub pixel, the red light-emitting sub pixel, and the green light-emitting sub pixel. However, the blue light-emitting sub pixel, the green light-emitting sub pixel, and the red light-emitting sub pixel are preferably have the values of drive voltage as close as possible. When the blue light-emitting sub pixel, the green light-emitting sub pixel, and the red light-emitting sub pixel have varying values of drive voltage, such a value variation of drive voltage is preferably reduced as much as possible. Moreover, when the pixel area varies thereamong, when an expression of Area of red light-emitting sub pixel≤Area of green light-emitting sub pixel<Area of blue light-emitting sub pixel is established, the larger the pixel area, the larger the number of dark dots will be.

Figure 8:
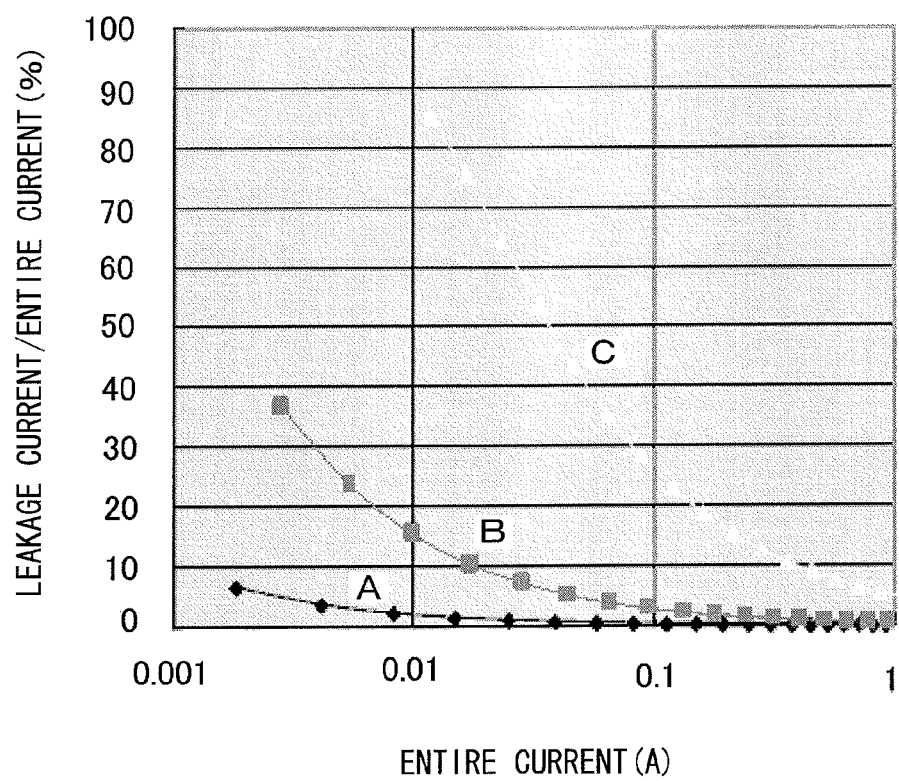
FIG. 8 is a characteristic diagram showing the result of a simulation conducted for a proportional change of a leakage current in the entire current when the entire current for pixel driving shows a change.

FIG. 8 shows the result of a simulation conducted for a proportional change of a leakage current in the entire current when the entire current for pixel driving shows a change. When the entire current is reduced, the proportion of the leakage current due to any foreign substance is increased. Moreover, when the resistance of the resistance layer is increased, the result shows that the proportion of the leakage current is suppressed. Herein, in FIG. 8, a curve "A" denotes data when the resistance layer has the resistance of $1\times10^4 \Omega$, a curve "B" denotes data when the resistance layer has the resistance of $1\times10^5 \Omega$, and a curve "C" denotes data when the resistance layer has the resistance of $1\times10^6 \Omega$.

In the third embodiment, for the aim to equalize as much as possible the values of drive voltage between the blue light-emitting sub pixel, the green light-emitting sub pixel, and the red light-emitting sub pixel, the resistance layer may be varied in resistance value per unit area depending on which part of the resistance layer is positioned above which sub pixel, i.e., the part of the resistance layer positioned above the red light-emitting sub pixel may have the electrical resistance value $R_R$ per unit area, the part of the resistance layer positioned above the green light-emitting sub pixel may have the electrical resistance value $R_G$ per unit area, and the part of the resistance layer positioned above the blue light-emitting sub pixel may have the electrical resistance value $R_B$ per unit area. In other words, expressions of $R_B > R_G$, and $R_B > R_R$ are satisfied. To be more specific, $R_B = 150 \, \Omega \cdot cm^2$ $R_G = 50 \, \Omega \cdot cm^2$ $R_R = 100 \, \Omega \cdot cm^2$ This accordingly enables to equalize as much as possible the values of drive voltage between the blue light-emitting sub pixel, the green light-emitting sub pixel, and the red light-emitting sub pixel, thereby being able to minimize the value increase of drive voltage, and what is more, being able to prevent a possibility of causing a short circuit between the first and second electrodes without fail.

Figure 9:
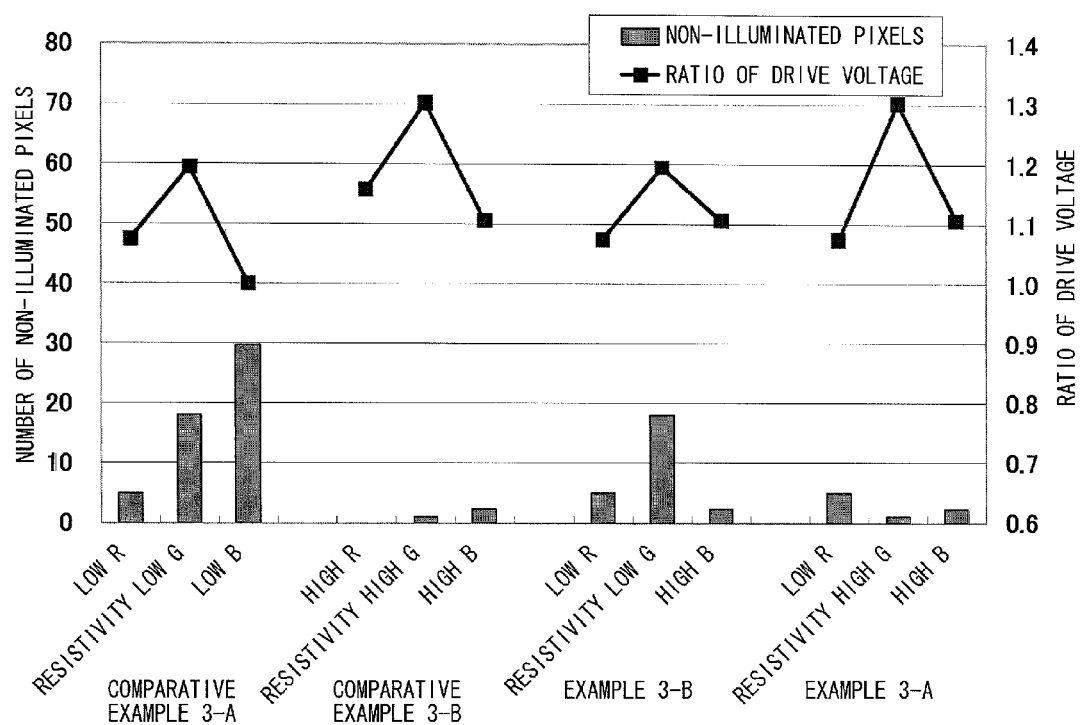
FIG. 9 is a diagram showing the result of an assessment made as to a ratio of drive voltage to each light-emitting sub pixel in the organic EL display device, and to the resulting number of dark dots in a third example.

An embodiment 3-A in FIG. 9 shows the result of an assessment made as to the ratio of drive voltage to each light-emitting sub pixel, and to the resulting number of dark dots in an organic EL display device having the resistance values per unit as below.

$R_B = 96 \, \Omega \cdot cm^2$ $R_G = 96 \, \Omega \cdot cm^2$ $R_R = 41 \, \Omega \cdot cm^2$ Further, an embodiment 3-B in FIG. 9 shows the result of an assessment made as to the ratio of drive voltage to each light-emitting sub pixel, and to the resulting number of dark dots in an organic EL display device having the resistance values per unit as below.

$R_B = 96 \, \Omega \cdot cm^2$ $R_G = 41 \, \Omega \cdot cm^2$ $R_R = 41 \, \Omega \cdot cm^2$ Still further, a comparative example 3-A in FIG. 9 shows the result of an assessment made as to the ratio of drive voltage to each light-emitting sub pixel, and to the resulting number of dark dots in an organic EL display device having the resistance values per unit as below.

$R_B = 41 \, \Omega \cdot cm^2$ $R_G = 41 \, \Omega \cdot cm^2$ $R_R = 41 \, \Omega \cdot cm^2$ Still further, a comparative example 3-B in FIG. 9 shows the result of an assessment made as to the ratio of drive voltage to each light-emitting sub pixel, and to the resulting number of dark dots in an organic EL display device having the resistance values per unit as below.

$R_B = 96 \, \Omega \cdot cm^2$ $R_G = 96 \, \Omega \cdot cm^2$ $R_R = 96 \, \Omega \cdot cm^2$ As is evident from FIG. 9, a lower resistance value increases the number of dark dots but can suppress the drive voltage to be low (refer to Comparative example 3-B). On the other hand, a higher resistance value reduces the number of dark dots but increases the drive voltage (refer to Comparative example 3-A). The number of dark dots is reduced in order of the blue light-emitting sub pixel, the green light-emitting sub pixel, and the red light-emitting sub pixel. On the other hand, in the embodiments 3-A and 3-B, by satisfying the expressions of $R_B > R_G$, and $R_B > R_R$, a good balance is achieved between the number of dark dots and the drive voltage.

In consideration thereof, the resistance layer is varied in thickness depending on which part of the resistance layer is positioned above which sub pixel, i.e., the part of the resistance layer positioned above the red light-emitting sub pixel, the part of the resistance layer positioned above the green light-emitting sub pixel, and the part of the resistance layer positioned above the blue light-emitting sub pixel, for example. To be specific, after the resistance layer is formed, the part of the resistance layer positioned above the red light-emitting sub pixel is formed thereon with a resist layer. Thereafter, the part of the resistance layer positioned above the red light-emitting sub pixel is coated by the resist layer, and then the part of the resistance layer positioned above the green light-emitting sub pixel and that above the blue light-emitting sub pixel are both exposed. The part of the resistance layer positioned above the green light-emitting sub pixel and that above the blue light-emitting sub pixel are each partially etched in the thickness direction. Next, the resist layer is removed, and the part of the resistance layer positioned above the red light-emitting sub pixel and that above the green light-emitting sub pixel are both coated by the resist layer. The part of the resistance layer positioned above the blue light-emitting sub pixel is then exposed, and the part of the resistance layer positioned above the blue light-emitting sub pixel is partially etched in the thickness direction. Alternatively, the resistance layer may be varied in material depending on which part of the resistance layer is positioned above which sub pixel, i.e., the part of the resistance layer positioned above the red light-emitting sub pixel, the part of the resistance layer positioned above the green light-emitting sub pixel, and the part of the resistance layer positioned above the blue light-emitting sub pixel (e.g., in the second embodiment, after the first and second resistance layers are formed, the part of the second resistance layer positioned above the red light-emitting sub pixel and that above the green light-emitting sub pixel are both removed by etching). Still alternatively, the resistance layer may be varied in content of substance contributing to the resistance layer in terms of conductivity depending on which part of the resistance layer is positioned above which sub pixel, i.e., the part of the resistance layer positioned above the red light-emitting sub pixel, the part of the resistance layer positioned above the green light-emitting sub pixel, and the part of the resistance layer positioned above the blue light-emitting sub pixel.

Fourth Embodiment

Figure 10:
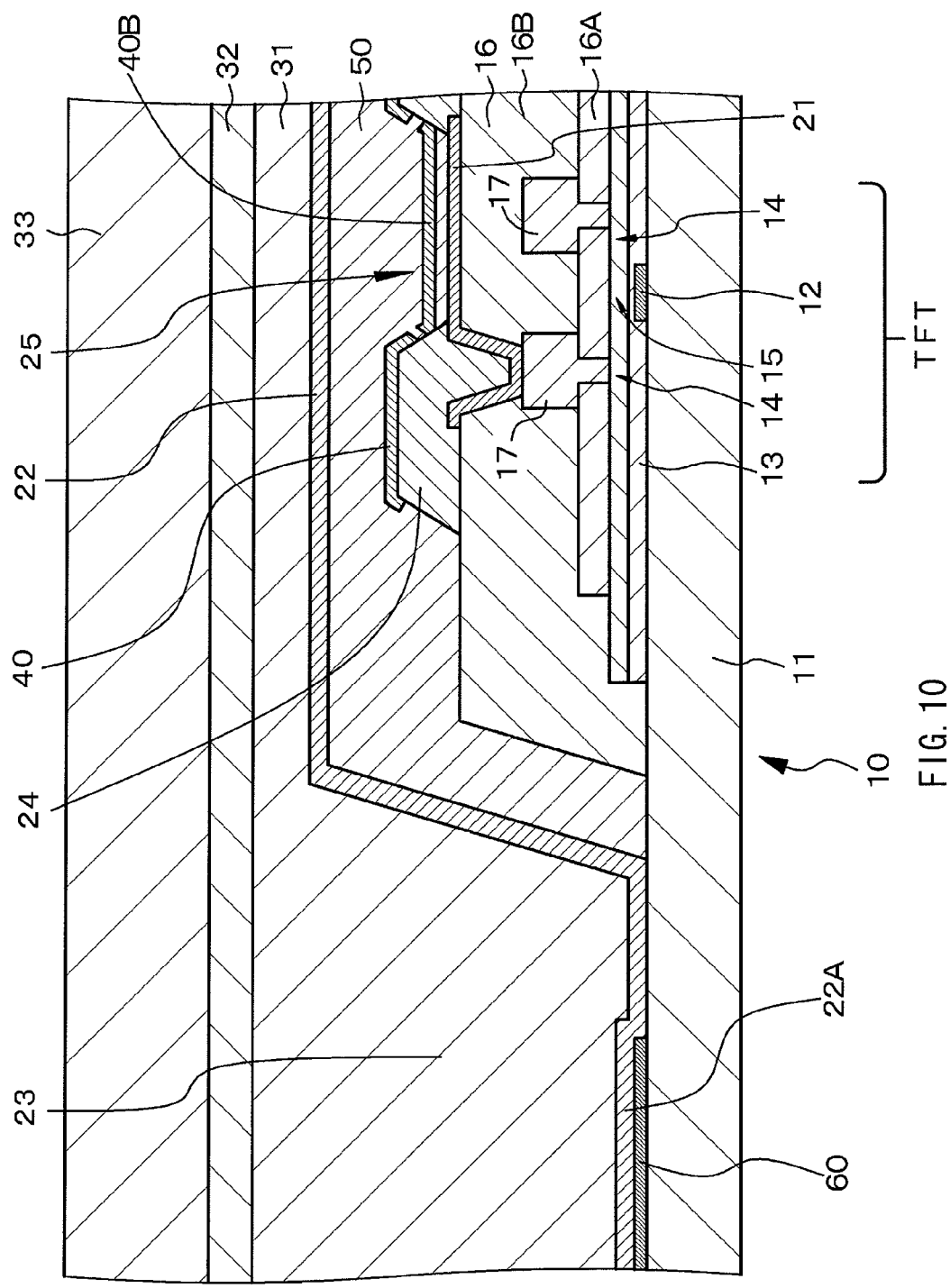
FIG. 10 is a schematic partial cross sectional view of the outer peripheral portion and therearound in the organic electroluminescent display device in a fourth example.
Figure 11:
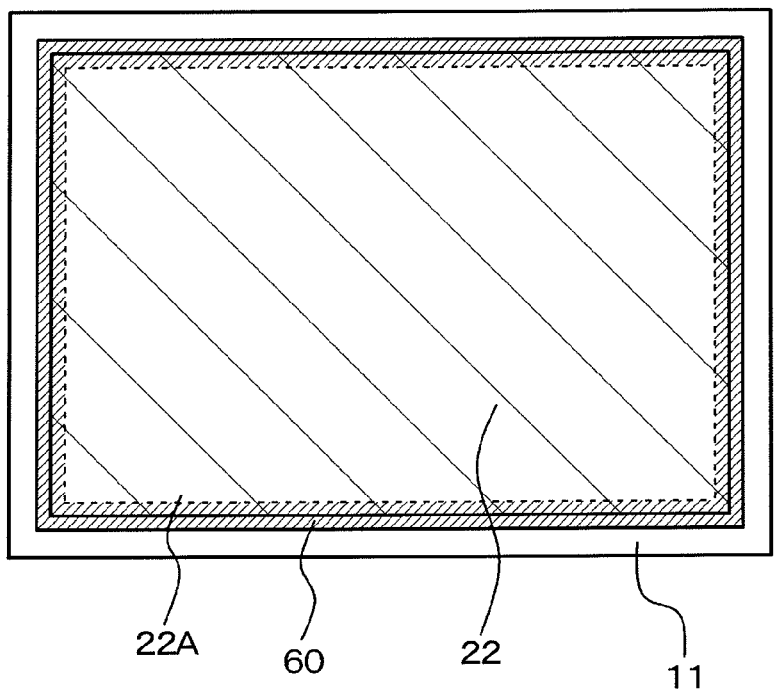
FIG. 11 is a diagram schematically showing the layout of an extraction electrode and a second electrode in the outer peripheral portion and therearound in the organic electroluminescent display device in the fourth example.

A fourth embodiment is also a modification of the first embodiment. In the fourth embodiment, an extraction electrode 60 is provided to the outer peripheral region of the organic EL display device for connecting the second electrode 22 to any external circuit (not shown). In the fourth embodiment, the extraction electrode 60 is provided to the outer peripheral portion of the first substance 11, and is configured by a titanium (Ti) film. In the second electrode 22, an extension portion 22A is extended onto the extraction electrode 60. FIG. 10 shows a schematic partial cross sectional view of the outer peripheral region and therearound in the organic EL display device in the fourth embodiment, and FIG. 11 schematically shows the layout of the extraction electrode 60 and the second electrode 22 in the outer peripheral region and therearound. Herein, in FIG. 11, the outer periphery of the extraction electrode 60 is indicated by a solid line, and the inner periphery thereof is indicated by dotted lines. For clearly indicating the extraction electrode 60, the extraction electrode 60 is hatched from upper right to lower left. On the other hand, for clearly indicating the second electrode 22 including the extension portion 22A, the second electrode 22 is hatched from upper left to lower right. As to the extraction electrode 60, during any process in [Step-100] to [Step-130] in the first embodiment, or during any process between these steps, the extraction electrode 60 may be provided in such a manner as to enclose the display region like a frame based on the technique in combination of sputtering and etching, or by PVD using a metal mask or by lift-off, for example. Note that when the extraction electrode 60 is overlaid on the various types of wiring patterns or others provided on the first substrate 11, an insulation film may be provided between the extraction electrode 60 and such various types of wiring patterns.

As such, the present invention is described based on the preferred embodiments, but the invention is surely not restrictive to such embodiments. In the embodiments, the structure and configuration of the organic EL display device and those of the organic EL element, and the material configuring the organic EL display device and that of the organic EL element are all only examples, and surely can be changed as appropriate. In the embodiments, the second substrate is disposed above the second electrode, but alternatively, the lamination order may be reversed, and as shown in Table 8 below, the first substrate may be disposed below the second electrode.

TABLE 8

| | |
|---|---|
| Second substrate 33: | Soda-lime glass |
| Adhesive layer 32: | Acrylic adhesive |
| Protection layer 31: | SiNx layer (thickness: 5 μm) |
| First electrode (Anode electrode) 21: | Al—Nd layer (thickness: 0.2 μm) |
| Organic layer 23: | as described above |
| Electron injection Layer: | LiF layer (thickness: 0.3 nm) |
| Semi-transmissive/reflective film 40: | Mg—Ag layer (thickness: 5 nm) |
| Resistance layer 50: | $Nb_2O_5$ layer (thickness: 0.5 μm) |
| Second electrode (Cathode Electrode) 22: | ITO layer (thickness: 0.1 μm) |
| Inter-layer insulation layer 16: | $SiO_2$ layer |
| TFT: | configuring organic EL element drive section |
| First substrate 11: | Soda-lime glass |

In the embodiments, the organic layer is formed to each of the light-emitting sub pixels, but in some cases, alternatively, the red light-emitting sub pixel and the green light-emitting sub pixel may be each formed thereon with an organic layer configuring the blue light-emitting sub pixel. In other words, as an alternative configuration, an organic layer configuring a blue light-emitting sub pixel may be formed entirely over the display region. If this is the configuration, the red light-emitting sub pixel may have the lamination configuration including an organic layer emitting a light of red, and another organic layer emitting a light of blue, and in such a configuration, a current flow between the first and second electrodes leads to light emission of red in color. Similarly, the green light-emitting sub pixel may have the lamination configuration including an organic layer emitting a light of green, and another organic layer emitting a light of blue, and in such a configuration, a current flow between the first and second electrodes leads to light emission of green in color.

Figure 12:
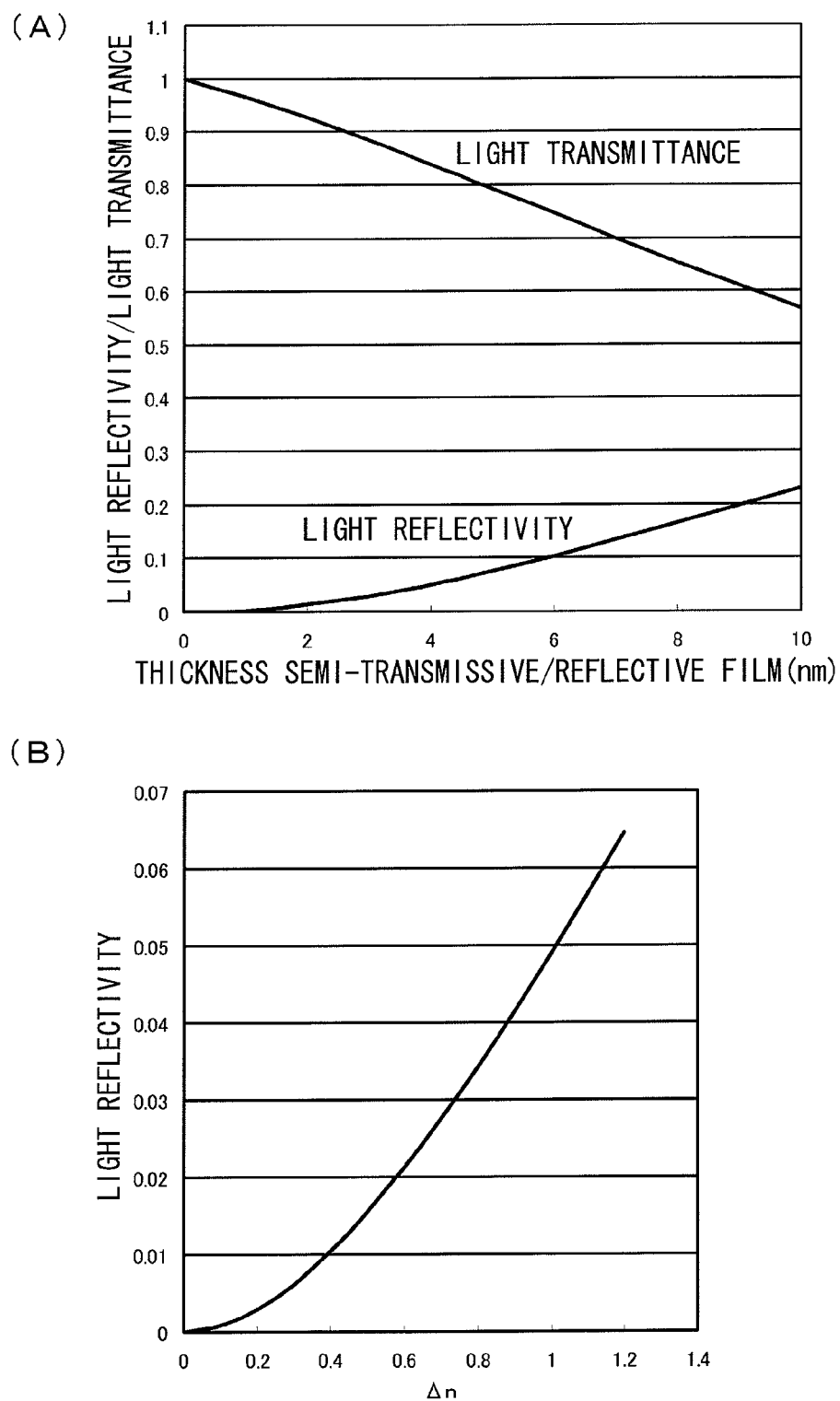
FIGS. 12(A) and (B) are respectively a graph showing the relationship between the film thickness of a semi-transmissive/reflective film and the value of an average light reflectivity, and a graph showing the relationship between the average light reflectivity and the difference of refractive index on the interface of a layer being a laminate of two layers varying in refractive index.
Figure 13:
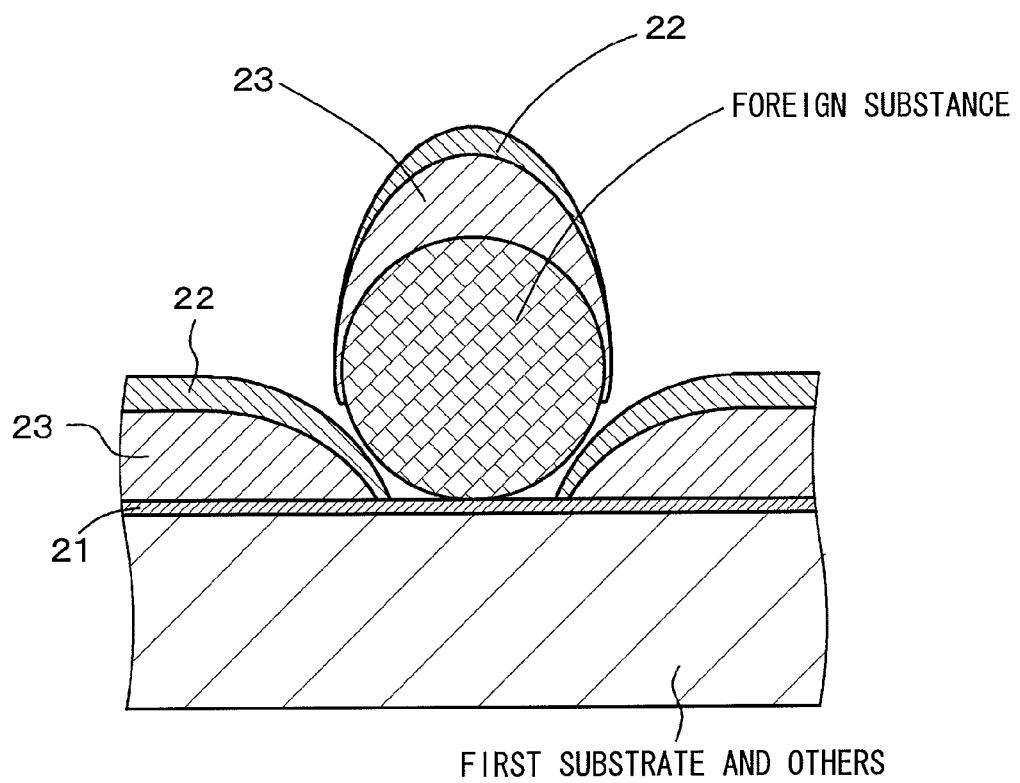
FIG. 13 is a partial cross sectional view of a previous organic electroluminescent display device, schematically showing the state of film formation of an organic layer or others when there is any foreign substance on a first electrode.

FIG. 12(A) exemplarily shows a relationship between the film thickness of the semi-transmissive/reflective film 40 and the value of average light reflectivity with a wavelength of 530 nm. As shown in the drawing, when the semi-transmissive/reflective film 40 is reduced in film thickness, the value of average light reflectivity becomes closer to 0. As such, when the semi-transmissive/reflective film 40 is reduced in film thickness as such, the resulting semi-transmissive film 40 starts passing through most of the light. Moreover, FIG. 12(B) exemplarily shows a relationship between, when a light with a wavelength of 530 nm comes from a certain layer A to a layer adjacent to the layer A, the average light reflectivity during the light reflection on the interface between the layers A and B, and a difference Δn of the refractive index of a material configuring the layer A and the refractive index of a material configuring the layer B. As shown in the drawing, based on Fresnel reflection, the larger the value of Δn, the larger the value of average light reflectivity becomes.

As such, when the semi-transmissive/reflective film 40 is reduced in film thickness, and when the resulting semi-transmissive/reflective film 40 starts passing through most of the light, light reflection occurs on a third interface being an interface between the semi-transmissive/reflective film 40 and the resistance layer 50. Alternatively, when the resistance layer 50 is in the lamination configuration including at least two resistance layers, light reflection occurs mainly on a fourth interface being an interface between the first and second resistance layers due to a dependency on the semi-transmissive/reflective film 40, and on the material or others configuring the resistance layer in the lamination configuration. As a result, the light generated in the light-emitting layer can be made to resonate between the first interface being an interface between the first electrode 21 and the organic layer 23, and the third interface being an interface between the semi-transmissive/reflective film 40 and the resistance layer 50. Alternatively, the light generated in the light-emitting layer can be made to resonate between the first interface being an interface between the first electrode 21 and the organic layer 23, and the fourth interface being an interface between the first and second resistance layers. Still alternatively, the light generated in the light-emitting layer can be made to resonate between the first and third interfaces, and the light generated in the light-emitting layer can be made to resonate between the first and fourth interfaces.

As such, in such a case, in the light-emitting element in the second aspect of the invention, as alternatives to the distance $L_2$ denoting a distance from the second interface being an interface between the semi-transmissive/reflective film and the organic layer to the position on the light-emitting layer where the level of light emission is maximum, and the optical distance $OL_2$ denoting an optical distance thereof, the distance $L_2$ may denote a distance from the third or fourth interface to the position on the light-emitting layer where the level of light emission is maximum, and the optical distance $OL_2$ may denote an optical distance thereof. Such an aspect is also included in the light-emitting element in the second aspect of the invention. Moreover, $\phi_2$ is assumed to denote the amount of phase shift (unit: radian) of a reflected light generated on the third or fourth interface [where $-2\pi<\phi_2\leq 0$]. On the other hand, in the light-emitting element in the third aspect of the invention, as alternatives to the optical distance L denoting a distance from the second interface being an interface between the semi-transmissive/reflective film and the organic layer, and φ radian denoting the sum of phase shift to be observed when the light generated in the light-emitting layer is reflected on the first and second interfaces [where $-2\pi<\phi\leq 0$], the optical distance L may denote an optical distance from the third or fourth interface, and φ radian may denote the sum of phase shift to be observed when the light generated in the light-emitting layer is reflected on the first and third interfaces or on the fourth interface [where $-2\pi<\phi 0$]. Such an aspect is also included in the light-emitting element in the third aspect of the invention. Moreover, in the light-emitting elements in the fourth, fifth, and sixth aspects of the invention, instead of resonating the light generated in the light-emitting layer between the first interface being an interface between the first electrode and the organic layer and the second interface being an interface between the semi-transmissive/reflective film and the organic layer, and instead of emitting a part of the resulting light from the semi-transmissive/reflective film, the light generated in the light-emitting later may be made to resonate between the first interface being an interface between the first electrode and the organic layer and the third or fourth interface, and a part of the resulting light may be emitted from the semi-transmissive/reflective film. Such an aspect is also included in the light-emitting elements in the fourth, fifth, and sixth aspects of the invention.

As described above, when light reflection occurs mainly on the third interface being an interface between the semi-transmissive/reflective film 40 and the resistance layer 50, or when light reflection occurs mainly on the fourth interface being an interface between the first and second resistance layers, the "second interface being an interface between the semi-transmissive/reflective film and the organic layer" may be replaced with the "third interface being an interface between the semi-transmissive/reflective film and the resistance layer" or the "fourth interface being an interface between the first and second resistance layers".

To be specific, in a light-emitting element produced to have the configuration as shown in Table 9 below, i.e., a resistance layer is a combination of first and second resistance layers, light reflection occurs on a third interface being an interface between a semi-transmissive/reflective film and the resistance layer, and on a fourth interface being an interface between the first and second resistance layers. In comparison with a light-emitting element in which a resistance layer is configured only by a second resistance layer, the efficiency of light emission is 1.3 times higher. Note that, for the relationship between the refractive index $n_1$ of a material configuring the first resistance layer, the refractive index $n_2$ of a material configuring the second resistance layer, and the refractive index $n_0$ of a material configuring the top layer of the organic layer, the efficiency is a high priority as $$-0.6 \leq n_0 - n_1 \leq -0.4$$

$$0.4 \leq n_1 - n_2 \leq 0.9$$

TABLE 9

| | |
|---|---|
| Second substrate: | soda-lime glass |
| Adhesive layer: | Acrylic adhesive |
| Protection layer: | $SiN_x$ layer (thickness: 5 μm) |
| Second electrode: | ITO layer (thickness: 0.1 μm) |
| Second resistance layer: | Thickness 0.5 μm (Refractive index $n_2$: 1.7) |
| First resistance layer: | Thickness 0.06 μm (Refractive index $n_1$: 2.4) |
| Semi-transmissive/reflective film: | Mg—Ag layer (thickness: 2 nm) |
| Organic layer (entirely): | Thickness 130 nm (Refractive index $n_0$: 1.8) |
| First electrode: | Al—Nd layer (thickness: 0.2 μm) |
| Inter-layer insulation layer: | $SiO_2$ layer |
| TFT: | configuring organic EL element drive section |
| First substrate: | Soda-lime glass |

The invention claimed is:

1. A light-emitting element, comprising:
(A) a first electrode;
(B) an organic layer including a light-emitting layer made of an organic light-emitting material;
(C) a semi-transmissive/reflective film;
(D) a resistance layer; and
(E) a second electrode,
wherein,
the first electrode is configured to reflect light coming from the light-emitting layer,
the second electrode is configured to allow light coming from the semi-transmissive/reflective film after passing therethrough,
the semi-transmissive/reflective film on the organic layer has an average film thickness of 1 nm to 6 nm both inclusive,
the light from the light-emitting layer is made to resonate between (i) a first interface between the first electrode and the organic layer, and (ii) a second interface between the semi-transmissive/reflective film and the organic layer, and
a part of the light is emitted from the semi-transmissive/reflective film.

2. The light-emitting element according to claim 1, wherein
the semi-transmissive/reflective film is made of alloys of magnesium-silver, aluminum, or silver.

3. The light-emitting element according to claim 1, wherein,
a material configuring the resistance layer has an electrical resistivity of $1 \times 10^6 \Omega m$ to $1 \times 10^{10} \Omega m$ both inclusive, and
the resistance layer above the organic layer has a thickness of 0.1 μm to 2 μm both inclusive.

4. The light-emitting element according to claim 1, wherein
the first electrode includes a foreign substance or a protrusion,
the semi-transmissive/reflective film is not formed to a region proximal to the foreign substance or the protrusion, and
the resistance layer exists in a region between (i) a portion of the semi-transmissive/reflective film in the periphery of the foreign substance or the protrusion, and (ii) a portion of the first electrode under the foreign substance or beneath the protrusion.

5. The light-emitting element according to claim 1, wherein
when a distance from the first interface being an interface between the first electrode and the organic layer to a position on the light-emitting layer where a level of light emission is maximum is $L_1$, an optical distance thereof is $OL_1$, a distance from the second interface being an interface between the semi-transmissive/reflective film and the organic layer to the position on the light-emitting layer where a level of light emission is maximum is $L_2$, and an optical distance thereof is $OL_2$, expressions (1-1) and (1-2) below are satisfied, $$0.7\{-\phi_1/(2\pi)+m_1\} \leq 2 \times OL_1/\lambda \leq 1.2\{-\phi_1/(2\pi)+m_1\} \quad (1\text{-}1)$$

$$0.7\{-\phi_2/(2\pi)+m_2\} \leq 2 \times OL_2/\lambda \leq 1.2\{-\phi_2/(2\pi)+m_2\} \quad (1\text{-}2)$$

where λ is a maximum peak wavelength in a spectrum of the light generated in the light-emitting layer,
$\phi_1$ is an amount of phase shift (unit: radian) of a reflected light generated on the first interface (where $-2\pi < \phi_1 \leq 0$)
$\phi_2$ is an amount of phase shift (unit: radian) of a reflected light generated on the second interface (where $-2\pi < \phi_2 \leq 0$), and
a value of ($m_1$, $m_2$) is (0, 0), (1, 0), or (0, 1).

6. The light-emitting element according to claim 1, wherein
when an optical distance between the first interface being an interface between the first electrode and the organic layer and the second interface being an interface between the semi-transmissive/reflective film and the organic layer is L, a sum of phase shift to be observed when the light generated in the light-emitting layer is reflected on the first and second interfaces is φ radian [where −2π<φ≤0], and a maximum peak wavelength in a spectrum of the light generated in the light-emitting layer is λ, an expression of $$0.7 \leq \{(2L)/\lambda + \phi/(2\pi)\} \leq 1.3$$

or $$-0.3 \leq \{(2L)/\lambda + \phi/(2\pi)\} \leq 0.3$$

is satisfied.

7. A light-emitting element, comprising:
(A) a first electrode;
(B) an organic layer including a light-emitting layer made of an organic light-emitting material;
(C) a semi-transmissive/reflective film;
(D) a resistance layer; and
(E) a second electrode, in this order,
wherein
the first electrode is configured to reflect light coming from the light-emitting layer,
the second electrode is configured to transmit light coming from the semi-transmissive/reflective film after passing through the semi-transmissive/reflective film, and
when an distance from a first interface between the first electrode and the organic layer to a position on the light-emitting layer where a level of light emission is maximum is $L_1$, an optical distance thereof is $OL_1$, a distance from a second interface between the semi-transmissive/reflective film and the organic layer to a position on the light-emitting layer where a level of light emission is maximum is $L_2$, and an optical distance thereof is $OL_2$, expressions (1-1) and (1-2) below are satisfied, $$0.7\{-\phi_1/(2\pi)+m_1\} \leq 2 \times OL_1/\lambda \leq 1.2\{-\phi_1/(2\pi)+m_1\} \quad (1\text{-}1)$$

$$0.7\{-\phi_2/(2\pi)+m_2\} \leq 2 \times OL_2/\lambda \leq 1.2\{-\phi_2/(2\pi)+m_2\} \quad (1\text{-}2)$$

where λ is a maximum peak wavelength in a spectrum of a light generated in the light-emitting layer,
$\phi_1$ is an amount of phase shift (unit: radian) of a reflected light generated on the first interface (where $-2\pi<\phi_1\leq 0$)
$\phi_2$ is an amount of phase shift (unit: radian) of a reflected light generated on the second interface (where $-2\pi<\phi_2\leq 0$), and
a value of $(m_1, m_2)$ is (0, 0), (1, 0), or (0, 1).

8. A light-emitting element, comprising:
(A) a first electrode;
(B) an organic layer including a light-emitting layer made of an organic light-emitting material;
(C) a semi-transmissive/reflective film;
(D) a resistance layer; and
(E) a second electrode,
wherein
the first electrode reflects a light coming from the light-emitting layer,
the second electrode passes through a light coming from the semi-transmissive/reflective film after passing through the semi-transmissive/reflective film, and
when an optical distance between a first interface between the first electrode and the organic layer and a second interface between the semi-transmissive/reflective film and the organic layer is L, a sum of phase shift to be observed when a light generated in the light-emitting layer is reflected on the first and second interfaces is φ radian [where −2π<φ≤0], and a maximum peak wavelength in a spectrum of the light generated in the light-emitting layer is λ, an expression of $$0.7 \leq \{(2L)/\lambda + \phi/(2\pi)\} \leq 1.3$$

or $$-0.3 \leq \{(2L)/\lambda + \phi/(2\pi)\} \leq 0.3$$

is satisfied.

9. An organic electroluminescent display device, including a plurality of organic electroluminescent elements each comprising:
(a) a first electrode;
(b) an insulation layer including an aperture, and from a bottom portion of the aperture, the first electrode is exposed;
(c) an organic layer that is disposed from the above of a portion of the first electrode exposed from the bottom portion of the aperture to a portion of the insulation layer around the aperture, and includes a light-emitting layer made of an organic light-emitting material;
(d) a semi-transmissive/reflective film formed at least on the organic layer;
(e) a resistance layer covering the semi-transmissive/reflective film; and
(f) a second electrode formed on the resistance layer,
wherein
the first electrode reflects a light coming from the light-emitting layer,
the second electrode passes through a light coming from the semi-transmissive/reflective film after passing therethrough, and
a portion of the semi-transmissive/reflective film on the insulation layer is at least partially discontinuous.

10. The organic electroluminescent display device according to claim 9, wherein
the semi-transmissive/reflective film on the organic layer has an average film thickness of 1 nm to 6 nm both inclusive.

11. The organic electroluminescent display device according to claim 9, wherein
the semi-transmissive/reflective film is made of alloys of magnesium-silver, aluminum, or silver.

12. The organic electroluminescent display device according to claim 9,
wherein
a material configuring the resistance layer has an electrical resistivity of $1\times10^6\Omega m$ to $1\times10^{10}\Omega m$ both inclusive, and
the resistance layer above the organic layer has a thickness of 0.1 μm to 2 μm both inclusive.

13. The organic electroluminescent display device according to claim 9,
wherein
there is a foreign substance or a protrusion
the semi-transmissive/reflective film is not formed to a region proximal to the foreign substance or the protrusion, and
the resistance layer exists in a region between (i) a portion of the semi-transmissive/reflective film in the periphery of the foreign substance or the protrusion, and a (ii) portion of the first electrode under the foreign substance or beneath the protrusion.

14. The organic electroluminescent display device according to claim 9,
wherein
a light generated in the light-emitting layer is made to resonate between a first interface between the first electrode and the organic layer and a second interface
a part of the resulting light is emitted from the semi-transmissive/reflective film.

15. The organic electroluminescent display device according to claim 14,
wherein
when a distance from the first interface between the first electrode and the organic layer to a position on the light-emitting layer where a level of light emission is maximum is $L_1$, an optical distance thereof is $OL_1$, a distance from the second between the semi-transmissive/reflective film and the organic layer to a position on the light-emitting layer where a level of light emission is maximum is $L_2$, and an optical distance thereof is $OL_2$, expressions (1-1) and (1-2) below are satisfied, $$0.7\{-\phi_1/(2\pi)+m_1\} \le 2\times OL_1/\lambda \le 1.2\{-\phi_1/(2\pi)+m_1\} \quad (1\text{-}1)$$

$$0.7\{-\phi_2/(2\pi)+m_2\} \le 2\times OL_2/\lambda \le 1.2\{-\phi_2/(2\pi)+m_2\} \quad (1\text{-}2)$$

where $\lambda$ is a maximum peak wavelength in a spectrum of the light generated in the light-emitting layer, $\phi_1$ is an amount of phase shift (unit: radian) of a reflected light generated on the first interface (where $-2\pi < \phi_1 \le 0$)

$\phi_2$ is an amount of phase shift (unit: radian) of a reflected light generated on the second interface (where $-2\pi < \phi_2 \le 0$), and a value of $(m_1, m_2)$ is $(0, 0)$, $(1, 0)$, or $(0, 1)$.

16. The organic electroluminescent display device according to claim 14,
wherein
when an optical distance between the first interface between the first electrode and the organic layer and the second interface between the semi-transmissive/reflective film and the organic layer is L, a sum of phase shift to be observed when the light generated in the light-emitting layer is reflected on the first and second interfaces is $\phi$ radian [where $-2\pi < \phi \le 0$], and a maximum peak wavelength in a spectrum of the light generated in the light-emitting layer is $\lambda$,
an expression of $$0.7 \le \{(2L)/\lambda + \phi/(2\pi)\} \le 1.3$$

or $$-0.3 \le \{(2L)/\lambda + \phi/(2\pi)\} \le 0.3$$

is satisfied.

* * * * *